US012585542B2

(12) United States Patent　　(10) Patent No.:　US 12,585,542 B2

Confalonieri et al.　　(45) **Date of Patent:　\*Mar. 24, 2026**

(54) LOCKED RAID WITH COMPRESSION FOR MEMORY INTERCONNECT APPLICATIONS HAVING A SHARED CACHE LINE

(71) Applicant: Micron Technology, Inc., Boise, ID (US)

(72) Inventors: Emanuele Confalonieri, Segrate (IT); Marco Sforzin, Cernusco sul Naviglio (IT)

(73) Assignee: Micron Technology, Inc., Boise, ID (US)

( \* ) Notice: Subject to any disclaimer, the term of this patent is extended or adjusted under 35 U.S.C. 154(b) by 0 days.

This patent is subject to a terminal disclaimer.

(21) Appl. No.: 18/778,641

(22) Filed: Jul. 19, 2024

(65) Prior Publication Data

US 2025/0086059 A1　　Mar. 13, 2025

Related U.S. Application Data

(60) Provisional application No. 63/517,331, filed on Aug. 2, 2023.

(51) Int. Cl.
| | |
|---|---|
| *G06F 11/00* | (2006.01) |
| *G06F 11/07* | (2006.01) |
| *G06F 11/10* | (2006.01) |
| *H03M 7/30* | (2006.01) |

(52) U.S. Cl.
CPC ...... *G06F 11/1096* (2013.01); *G06F 11/0727* (2013.01); *H03M 7/6041* (2013.01)

(58) Field of Classification Search
CPC ............. G06F 11/1096; G06F 11/0727; G06F 11/076; H03M 7/6041
USPC ...................................................... 714/1–57
See application file for complete search history.

(56) References Cited

U.S. PATENT DOCUMENTS

| | | | |
|---|---|---|---|
| 6,950,901 B2 * | 9/2005 | Chiu ................... | G06F 11/1076 |
| | | | 714/6.24 |
| 7,539,991 B2 * | 5/2009 | Leong .................. | G06F 3/0689 |
| | | | 714/6.24 |
| 2004/0205387 A1 * | 10/2004 | Kleiman .............. | G06F 3/0689 |
| | | | 714/E11.034 |
| 2011/0208995 A1 * | 8/2011 | Hafner ................ | G06F 11/1474 |
| | | | 711/155 |

(Continued)

*Primary Examiner* — Sarai E Butler

(74) *Attorney, Agent, or Firm* — Wood IP, LLC; Theodore A. Wood

(57) ABSTRACT

Provided is a device that includes an interface operatively coupled to a locked redundant array of independent disks (LRAID) including M (M>1) memory dice, the M memory dice stores stripes of data, and each stripe spanning over the M memory dice; and control circuitry that performs data compression on data to generate compressed data; stores the compressed data in the stripes; generates parity data of each stripe; determines, for each stripe, memory dice required to store the compressed data; determines, for each stripe, whether memory dice required to store the compressed data in each stripe is N memory dice or less; where N is an integer less than M; and determines, for each stripe, which stripes will store the parity data of a respective stripe based on the determination of whether the memory dice required to store the compressed data in the respective stripe is N memory dice or less.

20 Claims, 13 Drawing Sheets

(56)         References Cited

U.S. PATENT DOCUMENTS

| 2014/0229670 A1* | 8/2014 | Madhusudana ..... G06F 12/0815 |
| | | 711/113 |
| 2016/0004642 A1* | 1/2016 | Sugimoto ........... G06F 12/0864 |
| | | 711/128 |
| 2019/0212949 A1* | 7/2019 | Pletka ................... G06F 3/0619 |
| 2020/0034229 A1* | 1/2020 | Schneider ............. G06F 3/0689 |
| 2020/0192758 A1* | 6/2020 | Pletka ................... G06F 3/0665 |
| 2022/0129164 A1* | 4/2022 | Shveidel ................. G06F 3/064 |
| 2024/0070024 A1* | 2/2024 | Gatto ................. G06F 11/1004 |

* cited by examiner

Bus Length BL32 x8

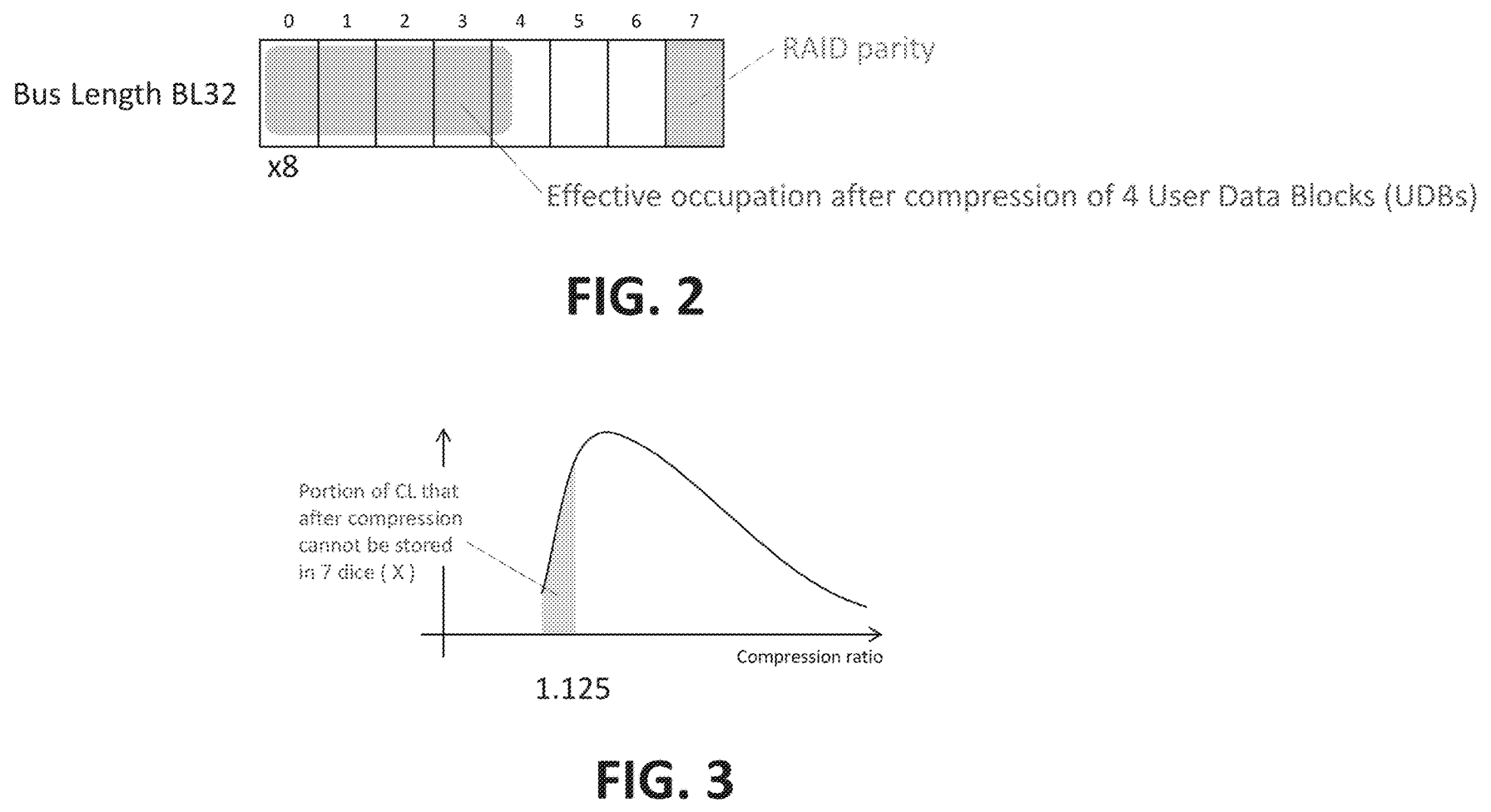

RAID parity

Effective occupation after compression of 4 User Data Blocks (UDBs)

FIG. 2

Compression ratio

Portion of CL that
after compression
cannot be stored
in 7 dice ( X )

Cache line enough compressed

Cache line not-enough compressed

Cache line enough compressed

Cache line not-enough compressed

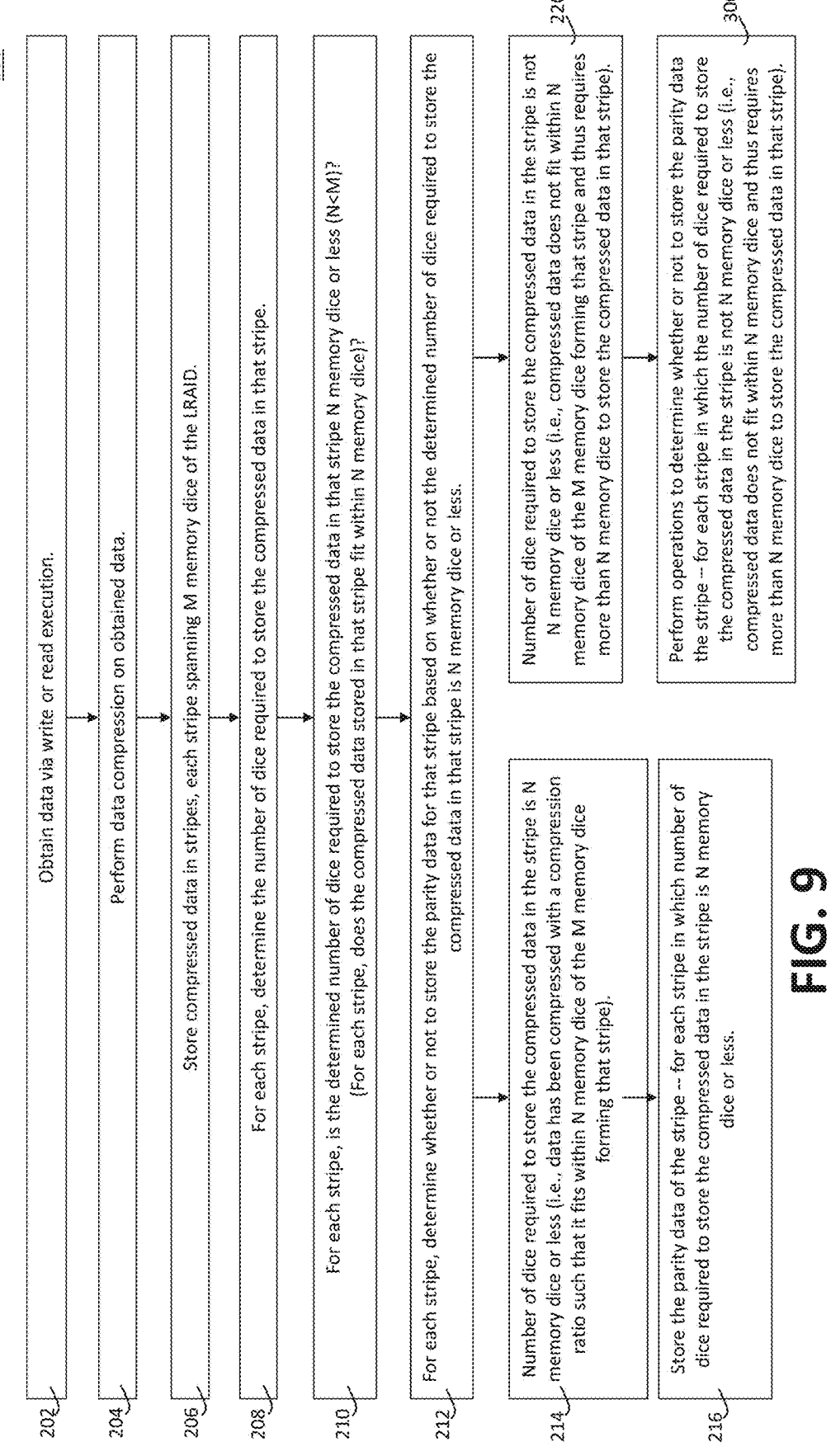

202 — Obtain data via write or read execution.

204 — Perform data compression on obtained data.

206 — Store compressed data in stripes, each stripe spanning M memory dice of the LRAID.

208 — For each stripe, determine the number of dice required to store the compressed data in that stripe.

210 — For each stripe, is the determined number of dice required to store the compressed data in that stripe N memory dice or less (N<M)? (For each stripe, does the compressed data stored in that stripe fit within N memory dice)?

212 — For each stripe, determine whether or not to store the parity data for that stripe based on whether or not the determined number of dice required to store the compressed data in that stripe is N memory dice or less.

214 — Number of dice required to store the compressed data in the stripe is N memory dice or less (i.e., data has been compressed with a compression ratio such that it fits within N memory dice of the M memory dice forming that stripe).

216 — Store the parity data of the stripe -- for each stripe in which number of dice required to store the compressed data in the stripe is N memory dice or less.

220 — Number of dice required to store the compressed data in the stripe is not N memory dice or less (i.e., compressed data does not fit within N memory dice of the M memory dice forming that stripe and thus requires more than N memory dice to store the compressed data in that stripe).

300 — Perform operations to determine whether or not to store the parity data the stripe -- for each stripe in which the number of dice required to store the compressed data in the stripe is not N memory dice or less (i.e., compressed data does not fit within N memory dice and thus requires more than N memory dice to store the compressed data in that stripe).

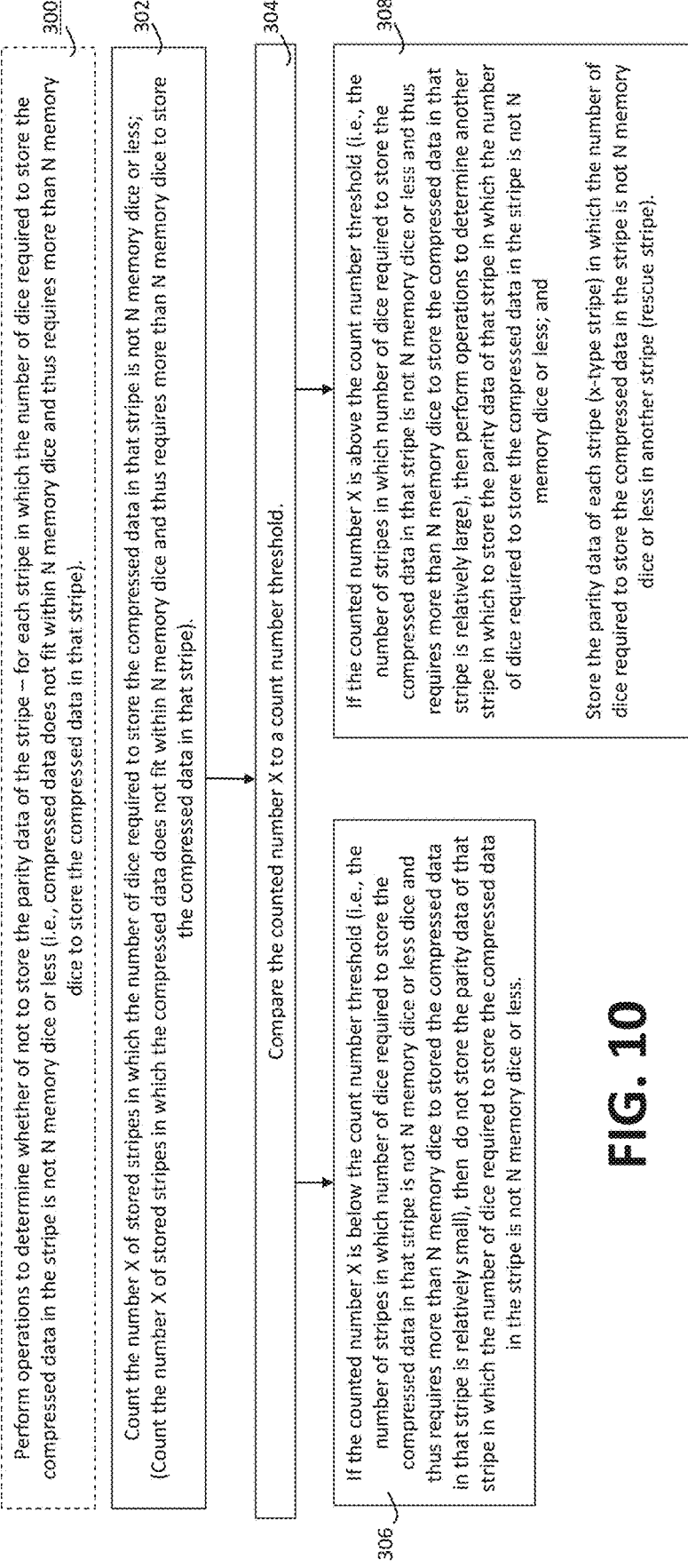

300 — Perform operations to determine whether of not to store the parity data of the stripe – for each stripe in which the number of dice required to store the compressed data in the stripe is not N memory dice or less (i.e., compressed data does not fit within N memory dice and thus requires more than N memory dice to store the compressed data in that stripe).

302 — Count the number X of stored stripes in which the number of dice required to store the compressed data in that stripe is not N memory dice or less; (Count the number X of stored stripes in which the compressed data does not fit within N memory dice and thus requires more than N memory dice to store the compressed data in that stripe).

304 — Compare the counted number X to a count number threshold.

308 — If the counted number X is above the count number threshold (i.e., the number of stripes in which number of dice required to store the compressed data in that stripe is not N memory dice or less and thus requires more than N memory dice to store the compressed data in that stripe is relatively large), then perform operations to determine another stripe in which to store the parity data of that stripe in which the number of dice required to store the compressed data in the stripe is not N memory dice or less; and Store the parity data of each stripe (x-type stripe) in which the number of dice required to store the compressed data in the stripe is not N memory dice or less in another stripe (rescue stripe).

306 — If the counted number X is below the count number threshold (i.e., the number of stripes in which number of dice required to store the compressed data in that stripe is not N memory dice or less dice and thus requires more than N memory dice to stored the compressed data in that stripe is relatively small), then do not store the parity data of that stripe in which the number of dice required to store the compressed data in the stripe is not N memory dice or less.

FIG. 10

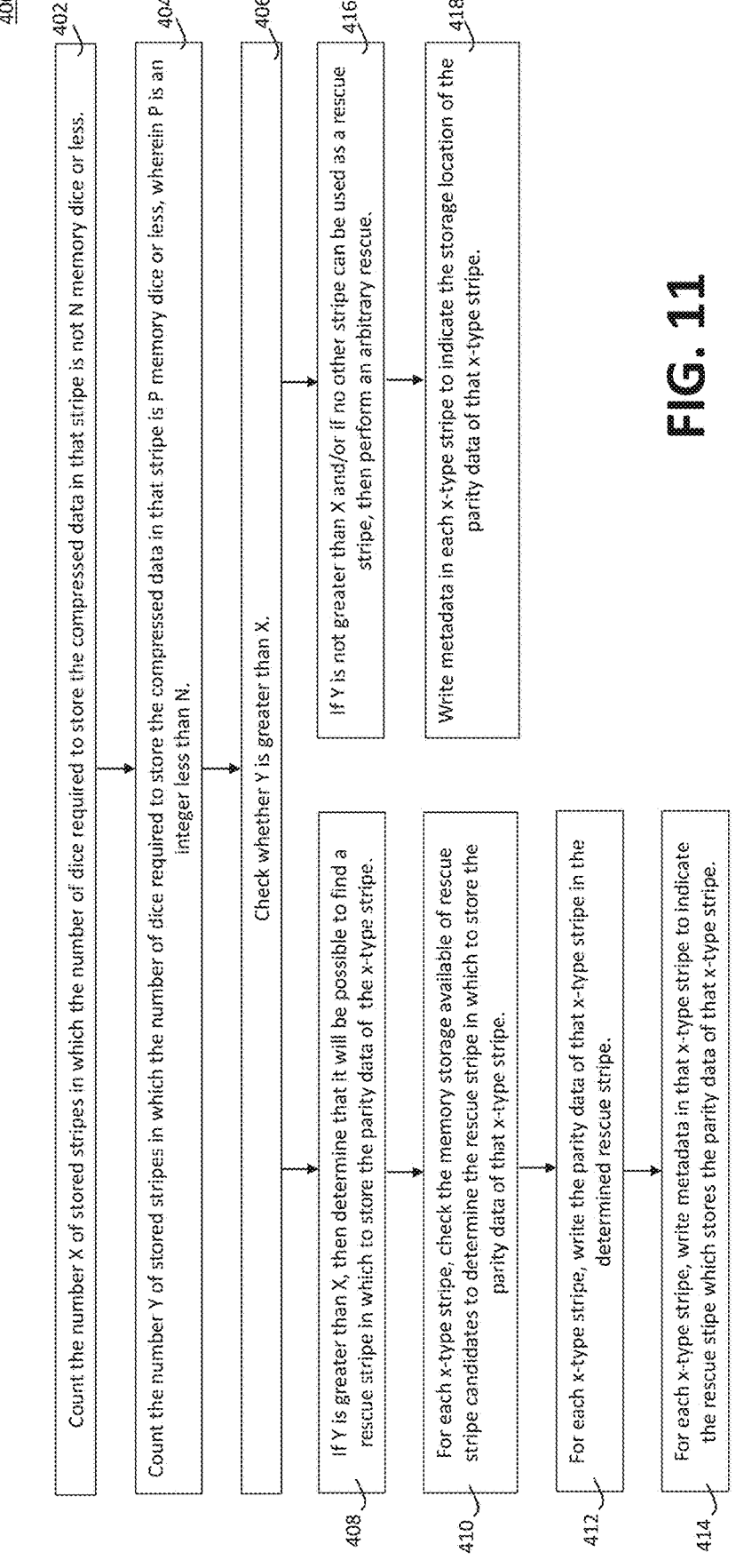

402 — Count the number X of stored stripes in which the number of dice required to store the compressed data in that stripe is not N memory dice or less.

404 — Count the number Y of stored stripes in which the number of dice required to store the compressed data in that stripe is P memory dice or less, wherein P is an integer less than N.

406 — Check whether Y is greater than X.

416 — If Y is not greater than X and/or if no other stripe can be used as a rescue stripe, then perform an arbitrary rescue.

418 — Write metadata in each x-type stripe to indicate the storage location of the parity data of that x-type stripe.

408 — If Y is greater than X, then determine that it will be possible to find a rescue stripe in which to store the parity data of the x-type stripe.

410 — For each x-type stripe, check the memory storage available of rescue stripe candidates to determine the rescue stripe in which to store the parity data of that x-type stripe.

412 — For each x-type stripe, write the parity data of that x-type stripe in the determined rescue stripe.

414 — For each x-type stripe, write metadata in that x-type stripe to indicate the rescue stipe which stores the parity data of that x-type stripe.

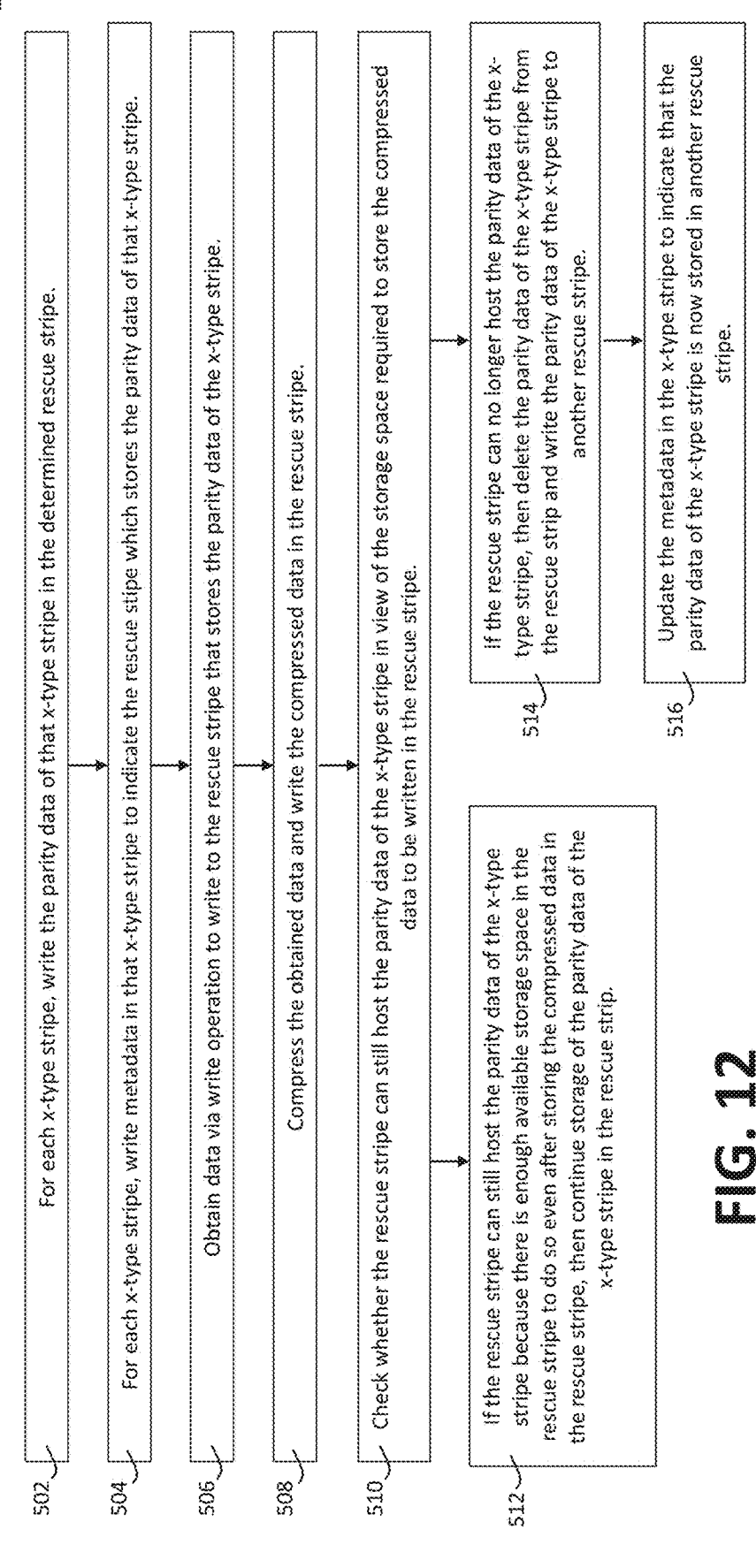

500

502 — For each x-type stripe, write the parity data of that x-type stripe in the determined rescue stripe.

504 — For each x-type stripe, write metadata in that x-type stripe to indicate the rescue stipe which stores the parity data of that x-type stripe.

506 — Obtain data via write operation to write to the rescue stripe that stores the parity data of the x-type stripe.

508 — Compress the obtained data and write the compressed data in the rescue stripe.

510 — Check whether the rescue stripe can still host the parity data of the x-type stripe in view of the storage space required to store the compressed data to be written in the rescue stripe.

512 — If the rescue stripe can still host the parity data of the x-type stripe because there is enough available storage space in the rescue stripe to do so even after storing the compressed data in the rescue stripe, then continue storage of the parity data of the x-type stripe in the rescue strip.

514 — If the rescue stripe can no longer host the parity data of the x-type stripe, then delete the parity data of the x-type stripe from the rescue strip and write the parity data of the x-type stripe to another rescue stripe.

516 — Update the metadata in the x-type stripe to indicate that the parity data of the x-type stripe is now stored in another rescue stripe.

FIG. 12

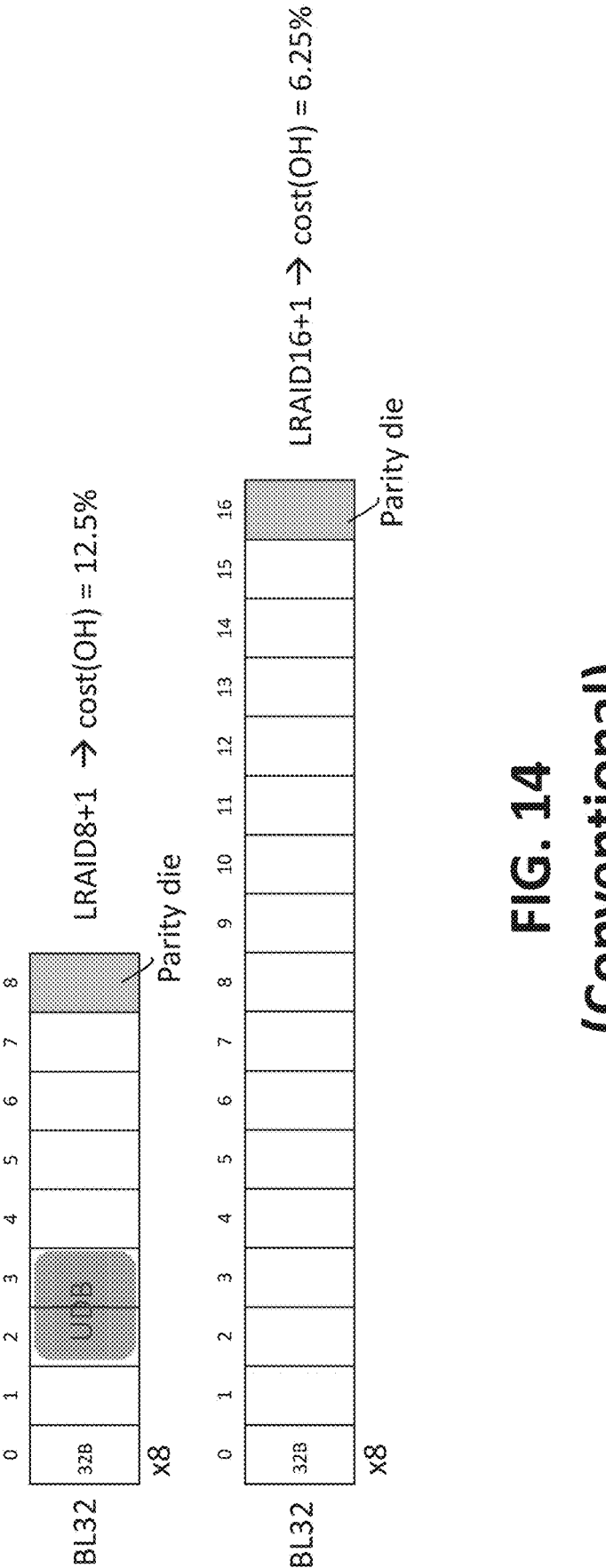
FIG. 14
(Conventional)

LOCKED RAID WITH COMPRESSION FOR MEMORY INTERCONNECT APPLICATIONS HAVING A SHARED CACHE LINE

CROSS-REFERENCE TO RELATED APPLICATION

This application claims benefit to U.S. Provisional Patent Application No. 63/517,331, filed Aug. 2, 2023, the disclosure of which are incorporated herein in their entireties, by reference.

FIELD OF TECHOLOGY

The present disclosure relates to memory media of locked redundant array of independent disk (LRAID) types, and in particular to LRAID with data compression for memory media.

BACKGROUND

Memory media (also referred to as "memory media devices") are widely used to store information in various electronic devices such as computers, user devices, wireless communication devices, cameras, digital displays, and the like. Information is stored by programing memory cells within a memory media device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory media device, a component may read, or sense, the state of one or more memory cells within the memory media device. To store information, a component may write, or program, one or more memory cells within the memory media device to corresponding states.

Various types of memory media devices exist, including magnetic hard disks, random access memory (RAM), read-only memory (ROM), dynamic RAM (DRAM), synchronous dynamic RAM (SDRAM), static RAM (SRAM), flash memory, and others. Memory media devices may be volatile or non-volatile. Volatile memory cells (e.g., DRAM cells) may lose their programmed states over time unless they are periodically refreshed by an external power source. DRAM is organized as an array of storage cells with each cell storing a programmed value. SRAM memory may maintain their programmed states for the duration of the system being powered on. Non-volatile memory cells (e.g., Not-AND (NAND) memory cells) may maintain their programmed states for extended periods of time even in the absence of an external power source.

Reliability, availability, and serviceability (RAS) are important considerations in many digital memory storage environments. The explosive growth of Internet content and the resulting data storage and computation requirements have resulted in the deployment of heterogeneous and sometimes complex data storage solutions in large-scale data centers, organizations, home computing environments, and even mobile computing environments. The increasing scale, intensity of use, criticality of applications etc. of such deployments bring their RAS capabilities into increasing focus.

BRIEF DESCRIPTION OF THE DRAWINGS

FIG. 2 graphically illustrates storage of compressed user data and RAID parity data in a LRAID8+1 array (with compression) such as that shown in FIG. 1, according to the embodiments.

FIG. 3 graphically illustrates an example compression ratio above which data compression of user data may be performed such that the compressed user data can be stored within a predetermined number of dice.

FIG. 9 illustrates a flow chart of a process performed by a memory device of a memory system, according to the embodiments.

FIG. 10 illustrates a flow chart of another process performed by a memory device of a memory system, according to the embodiments.

FIG. 11 illustrates a flow chart of a yet another process performed by a memory device of the memory system, according to the embodiments.

FIG. 12 illustrates a flowchart of one other process performed by a memory device of the memory system, according to some embodiments of the present disclosure.

FIG. 14 illustrates conventional LRAID8+1 (without compression) and conventional LRAID16+1 (without compression) memory systems requiring an additional memory device to store the RAID parity of the LRAID stripe.

DETAILED DESCRIPTION

Memory solutions in which multiple memory media devices (e.g., DRAM or other emerging memory dice) are incorporated in, or are associated with, one memory device, such as, for example, a memory controller, are growing in scale and importance. With such growth, the effective and efficient implementation of RAS capabilities in such memory solutions becomes increasingly important.

In view of the above-described importance of RAS capabilities, improved solutions for providing such capabilities in LRAID memory media device arrangements are needed.

Embodiments of this disclosure are directed to such improved solutions. More specifically, the embodiments are directed to accessing a plurality of memory media devices arranged as an LRAID organization. The embodiments provide efficient error detection and correction, and thus RAS with improved bandwidth utilization. Some embodiments provide CXL-compliant memory devices that take advantage of the RAS capabilities of CXL.

Figure 1:
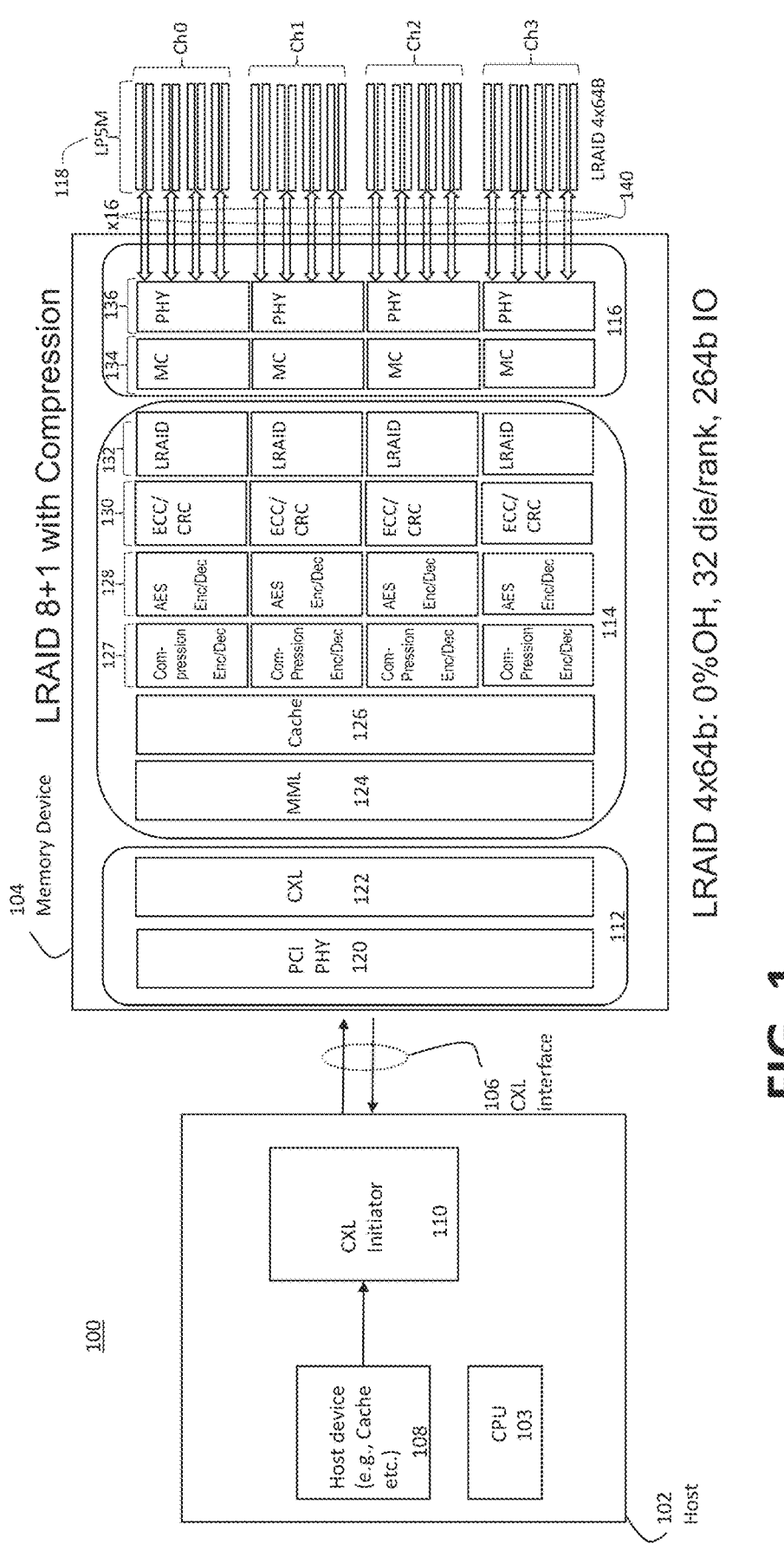
FIG. 1 illustrates an example functional block diagram of a computing system including an interface host device, an interface target device, and a communication interface, such as Compute Express Link™ (CXL™), connecting a host and target devices in accordance with embodiments of the present disclosure.

FIG. 1 illustrates an example functional block diagram of a computing system 100 including an interface host CXL initiator device 110, a CXL target controller 122, and a CXL communication interface 106 connecting the initiator device 110 and the CXL target controller 122. The host CXL initiator device 110 and the CXL target controller 122 are configured to improve bandwidth utilization for data requests in RAS-enabled LRAID memory arrangements in accordance with example embodiments. By way of example, the communication interface 106 may be constructed in accordance with CXL 2.0 and/or CXL 3.0 protocol specifications. The embodiments, however, are not limited to CXL or to the CXL protocol.

Host 102 may be a computer or the like with one or more processors 103 (e.g., central processing unit (CPU), graphics processing unit (GPU), application specific integrated circuit system (ASIC), field programmable gate array (FPGA), or another type of processor). The host 102 may further include a host component device 108, such as a cache memory.

The host 102 may be configured to access a device, such as a memory device 104 formed of a system-on-a-chip (SoC) including a memory controller. Memory device 104 may include one or more memory media 118, such as DRAM modules which may be LPDDR, DDR, or other type of DRAM. In some embodiments, the memory device 104 may be configured as the "main memory", or some other memory, of the host 102. Example embodiments are not limited to DRAM and may, for example, include memory devices 104 that have one or more memory media modules of one or a combination of memory types, such as DRAM and SRAM.

The host 102 and the memory device 104 communicate via the communication interface 106. Communication interface 106, in some embodiments, comprises two unidirectional links. For example, on one of the unidirectional links, the host 102 transmits messages to the memory device 104. On the other unidirectional link the memory device 104 may transmit messages to the host 102.

As noted above, in some embodiments, the memory device 104 may be a CXL-compliant memory system (e.g., the memory system can include a Peripheral Component Interconnect Express (PCIe)/CXL interface). For example, a frontend portion 112 of the memory device 104 includes a PCI/PCIe interface 120 and a CXL target controller 122. The PCI/PCIe interface 120 couples the memory device 104 to the host 102 through one or more input/output (I/O) lanes of communication interface 106. The communications over I/O lanes may be according to a protocol, such as PCIe. The plurality of I/O lanes can be configured as a single port. Example embodiments may not be limited by the number of I/O lanes, whether the I/O lanes belong to a single port, or the communication protocol for communicating with the host 102.

CXL is a dynamic multi-protocol technology designed to support accelerators and memory devices. In the CXL protocol, CXL (the link layer) is responsible for reliable transmission of transaction layer packets (TLP) across a Flex Bus link. CXL provides a rich set of protocols that include I/O semantics similar to PCIe (i.e., CXL.io), caching protocol semantics (i.e., CXL.cache), and memory access semantics (i.e., CXL.mem) over a discrete or on-package link. CXL.io is required for discovery and enumeration, error report, and host physical address (HPA) lookup. CXL.mem and CXL.cache protocols may be optionally implemented by the particular accelerator or memory device usage model.

CXL technology is built on the PCIe infrastructure, leveraging PCIe physical and electrical interfaces to provide advanced protocol in areas such as I/O protocol, memory protocol (e.g., initially allowing a host to share memory with an accelerator), and coherency interface. When the memory device 104 is CXL-compliant, the interface management circuitry (e.g., PCI interface 120) associated with target controller 122 (including data link and transaction control) uses CXL protocols to manage the communication interface 106, that may comprise PCIe physical (PHY) interfaces.

Flex Bus provides a point-to-point interconnect that can transmit native PCIe protocol or dynamic multi-protocol CXL to provide I/O, caching, and memory protocols over PCIe electricals. By way of example, the primary link attributes may include support of the following features: native PCIe mode, full feature support as defined in the PCIe specification; CXL mode, as defined in this specification; Configuration of PCIe vs CXL protocol mode; Signaling rate of 32 GT/s, degraded rate of 16 GT/s or 8 GT/s in CXL mode; Link width support for x16, x8, x4, x2 (degraded mode), and x1 (degraded mode).

When operating as a CXL interface based on PCIE 5.0/6.0, communication interface 106 comprises a pair of unidirectional links—each contributing to system bandwidth. CXL 2.0 provides an interface which leverages PCIE 5.0 (32 GT/s), and CXL 3.0 leverages PCIE 6.0 (64 GT/s) in each direction.

According to some embodiments in which the communication interface 106 operates in accordance with CXL, the memory device 104 is a CXL Type 3 device. That is, the interface operates in a host-target (also referred to as master-slave) mode in which the CXL initiator device 110 operates as host and the CXL target controller 122 operates as target. In other words, when the memory device is a CXL Type 3 device, all requests (e.g., read requests and write requests) are initiated by the host 102 and the memory device 104 responds to such requests. The embodiments, however, are not limited to host-target configurations.

Multiple requests and data are transported over the communication interface 106. The host 102 (e.g., CXL Initiator) is responsible for generating requests to the memory device (e.g., CXL target). The memory device has a CXL controller to process incoming media requests such as read and/or write requests from the host and forward the requests to the central controller and backend memory media (e.g., DRAM). In example embodiments, the controller 122 is configured to implement the functionality required by CXL.

According to some embodiments, memory media devices collectively referred to as 118 include one or more DRAM devices, that may be of a type, such as DDR, LPDDR, etc. In some embodiments, the main memory for computer system 100 is stored in DRAM cells that have high storage density. DRAM may be described as organized according to a hierarchy of storage organization comprising dual in-line memory modules (DIMMs), rank, bank, and an array.

A DIMM comprises a plurality of DRAM chips that are organized into one or more ranks. Each chip is formed of a plurality of banks. The banks are formed of one or more rows of the array of memory cells. All banks within the rank share all address and control pins. All banks are independent, but in some embodiments only one bank can be accessed at a time. Because of electrical constraints, only a few DIMMs can be attached to a bus. Ranks help increase the capacity on a DIMM.

Multiple DRAM dice (or chips) are used for every access to improve data transfer bandwidth. Multiple banks are provided so that the computing system can be simultaneously working on different requests.

In some embodiments, the memory media 118 is low power double data rate (LPDDR) LP5M or other similar memory interfaces. However, embodiments are not limited thereto, and memory media 118 may comprise one or more memory media of any memory media type, such as, but not limited to, types of DRAM.

The memory device 104 includes memory media controllers and other circuitry to control, in response to receiving a request or command from the host 102, performance of a memory operation. The memory operation can be a memory access operation to read data from, or write data to, memory media 118.

A backend portion 116 of the memory device 104 can include a plurality of media controllers 134 and a plurality of PHY interfaces 136, such that each of the media controllers 134 controls a group of one or more memory media 118 via a respective one of the PHY interfaces 136. Each of the plurality of media controllers 134 can receive the same command (e.g., to read or write memory media 118) and address and drive the plurality of channels connecting to the memory media substantially simultaneously.

By using the same command and address for the plurality of media controllers 134, each of the plurality of media controllers 134 can utilize the plurality of channels to perform the same memory operation on the same plurality of memory cells. Each of the media controllers 134 and/or each set of one or more channels of a plurality of channels, can be associated with a corresponding LRAID array.

As used herein, the term "substantially" intends that the characteristic need not be absolute but is close enough to achieve the advantages of the characteristic. For example, "substantially simultaneously" is not limited to operations that are performed simultaneously and can include timings intended to be simultaneous but due to manufacturing limitations may not be precisely simultaneously.

For example, due to read/write delays that may be exhibited by various interfaces (e.g., LPDDR5 vs. PCIe), media controllers that are utilized substantially simultaneously may not start or finish at the same time. For example, multiple media controllers can be utilized such that they are writing data to the memory devices at the same time, regardless of whether one of the media controllers commences or terminates prior to the other.

The backend portion 116 is configured to couple to memory media 118 via a plurality of channels 140 that facilitate reading/writing data to/from the memory media 118. This accommodates transmitting commands to memory media 118 to receive status and statistics from memory media 118, etc. The backend portion 116 includes media controllers 134 and PHY interfaces 136 connecting the media controllers 134 to the memory media 118.

In some embodiments, the backend portion 116 is configured to couple the PHY interfaces 136 to a plurality of memory ranks of the memory media 118. Memory ranks can be connected to the memory controller(s) 134 via the plurality of channels 140. A respective media controller 134 and a corresponding PHY interface 136 may drive a channel to a memory rank. In some embodiments, each media controller 134 can execute commands independent of the other media controllers 134. Therefore, data can be transferred from one PHY interface 136 through a respective one of the channels 140 to memory media 118 independent of other PHY interfaces and channels.

Each PHY interface 136 may operate in accordance with the PHY layer that couples the memory device 104 to one or more memory ranks in the memory media 118. As used herein, the term "PHY layer" generally refers to the physical layer in the Open Systems Interconnection (OSI) model of a computing system. The PHY layer may be the first (e.g., lowest) layer of the OSI model and can be used to transfer data over a physical data transmission medium. In some embodiments, the physical data transmission medium can be a plurality of channels.

As used herein, the term "memory ranks" generally refers to a plurality of memory chips (e.g., DRAM memory chips) that can be accessed simultaneously. In some embodiments, a memory rank may be sixty-four (64) bits wide and each memory rank may have eight (8) pages. In some embodiments, a page size of a first type of memory media device can be larger than a page size of the second type of memory media device. Example embodiments, however, are not limited to particular widths of memory ranks or page sizes.

Each media controller 134 may include a channel control circuitry and a plurality of bank control circuitry where a respective one of the plurality of bank control circuitry is configured to access a respective bank of the plurality of banks on the memory media 118 accessed by the respective media controller 116.

Rank, channel, and bank can be considered hardware-dependent logical groupings of storage locations in the media device. The mapping of rank, channel and bank logical groupings to physical storage locations or rows in the memory media device may be preconfigured, or may be configurable, in some embodiments by the memory controller in communication with the memory media 118.

In some embodiments, each media controller of the plurality of media controllers 134 can correspond to a respective LRAID array of LRAID circuitry 132, as well as to a respective error correction or cyclic redundancy check (ECC/CRC) circuitry of the ECC/CRC component 130. Each media controller of the plurality of media controllers 134 can also correspond to one of the plurality of PHY layers 136. Each PHY of the plurality of PHYs 136 can be coupled to the memory media 118 composed of DRAM memory devices. In some embodiments, each media controller of the plurality of media controllers 134 can execute commands independent of the other media controllers. Therefore, data can be transferred from a PHY layer through a channel of the plurality of channels 140 to a memory device of the memory media 118 independent of other PHYs in the plurality of PHYs 136.

The memory device 104 includes a central controller portion 114 between the circuitry of the frontend portion 112 and the circuitry of the backend portion 116. The central controller 114 may include a media management layer/interconnect 124, a cache memory 126 (including associated control circuitry), a compression engine or component 127, an Advanced Encryption Standard (AES) encryption component 128, the ECC/CRC component 130 and the LRAID circuitry 132.

The media management layer (MML) 124 may include a crossbar interconnection that can direct respective memory access requests to respective memory media 118. The cache memory 126 temporarily stores data associated with the performance of the memory operations to make memory accesses more efficient. In some embodiments, in response to receiving a request from the host 102, data read from or written to memory media 118 can be stored in cache lines of a cache memory 126 on the memory device 104. The data in the cache memory 126 can be written to the memory media 118 according to various cache policies. In some embodiments, the ECC/CRC component 130 on the memory device 104 is configured to provide error correction to data read from and/or written to memory media 118. The ECC/CRC component 130 can include ECC and/or CRC circuitry (sometimes referred to as ECC circuitry 130) to ECC encode or decode the data.

The central controller 114 also includes LRAID circuitry 132. The LRAID circuitry 132 may include a plurality of LRAID components to store the data on the memory media 118. As used herein, the term "LRAID components" generally refers to data storage virtualization technology that combines multiple memory media components ("media components") such as memory dice, physical memory chips, memory banks, or other memory unit, into one or more logical units for the purposes of data redundancy, performance improvement, or both.

In some embodiments, the central controller 114 and/or the LRAID circuitry 132 can include a finite state machine (FSM) and a plurality of LRAID components, wherein the FSM is operable to increase the reliability of the data and correct errors in the data. Each of the plurality of LRAID components shown in FIG. 1 controls a group of memory media 118 in a LRAID array in accordance with an FSM.

In some embodiments, each LRAID array can be coupled to circuitry from ECC/CRC component 130 in a manner that is independent of the ECC/CRC processing of other LRAID arrays in the LRAID circuitry 132. The ECC/CRC circuitry may have the detection ability to trigger the LRAID mechanism every time an error is detected in the user data pattern. Moreover, the ECC/CRC circuitry can also have an additional correction ability to correct a subset of errors detected in the decoding phase. In some embodiments, the ECC reduces to a CRC code that just allow to detect the error and trigger the LRAID recovery process. In some embodiments, each LRAID array controlled by the LRAID circuitry 132 can correspond to a group of the media controllers of the media controllers 134.

In an example embodiment, LRAID circuitry 132 is configured to provide a plurality of LRAID arrays, and each LRAID array controls access to a channel of 8 memory media 118. That is, a LRAID array is striped (data+parity) across 8 memory media 118 (i.e., 8 dice as shown in FIG. 1). In this example arrangement shown in FIG. 1, the group of eight memory media 118 (or eight dice) may be accessed via one of the channels 140. One or the media controllers 134 and one of the PHY 136 provide connection between the LRAID array and the corresponding group of media 118 (eight dice). This example arrangement allows a separate LRAID array of the LRAID circuitry 132 and a separate LRAID circuitry 132 to be dedicated to each of the channels 140.

A LRAID state machine can implement the functionality of the LRAID circuitry 132. By dedicating a separate LRAID array from the LRAID circuitry 132 and a separate media controller 134 to each channel 140, each channel 140 can be driven individually and receive a separate command and address than others of the channels 140. In some embodiments, each media controller 134 executes commands independent of the other media controllers 134.

This LRAID architecture can provide more flexibility to the memory system in regard to how much data is written to a memory media 118 and when the data is written to a memory media 118 in comparison to low power chip kill (LPCK) architecture. In some embodiments, a LRAID array can be striped across multiple channels 140. If a LRAID array is striped across multiple channels 140, a LRAID state machine can be shared across multiple channels. This allows a LRAID array to drive a plurality of channels 140 substantially simultaneously.

The LRAID array illustrated in FIG. 1 shows an LRAID 8+1 (with compression) system including four LRAID channels Ch0-Ch3 with each channel being 64 b. Each of the LRAID channels Ch0-Ch3 includes 8 memory devices (i.e., 8 dice) and is operatively coupled to separate ones of the LRAID circuitry 132 and a separate media controller 134 to perform read and write operations. As will be discussed in more detail below, each stripe of data may span over the 8 dice of one of the channels Ch0-Ch3. Because of the compression of the data in present example embodiments, the LRAID array does not need an additional die specifically dedicated for storing parity data and thus the overhead cost is 0%—in contrast to the overhead cost of 12.5% LRAID 8+1 (without compression) system shown in related art FIGS. 14-15.

The AES encryption component of central controller 114 provides a security component configured to encrypt the data before storing, and to decrypt data after reading, the data in memory media 118.

The data compression component 127 compresses obtained data to generate compressed data that may be written to the memory media 118. The data compression component 127 can use one of many known general compression algorithms to compress the data such as a lossless compression algorithm such as run-length encoding (RLE), LZ77 or LZ78. The compressed data may be stored in data stripes, each of which span over the M dice (M=8 in the embodiment illustrated in in FIG. 1) of the LRAID array of each channel Ch0-Ch3. The compression ratio of data stored in one stripe may be different than the compression ratio of data stored in another stripe depending on the data bit pattern of the data being compressed (e.g., depending on the repeating and consecutive data bit patterns of the data being compressed).

A management unit (not shown separately) located in the memory device 104 may be configured to control operations of the memory device 104. The management unit may recognize commands from the host 102 and accordingly manage the one or more memory media 118. In some embodiments, the management unit includes an I/O bus to manage out-of-band data, a management unit controller to execute a firmware whose functionalities include, but not limited to, monitoring and configuring the characteristics of memory device 104, and a management unit memory to store data associated with the memory device 104 functionalities. The management unit controller may also execute instructions associated with initializing and configuring the characteristics of memory device 104.

The central controller 114 (e.g., media management layer (MML) 124 in the central controller 114) can couple, by initializing and/or configuring the memory device 104 and/or the memory media 118 accordingly, the memory device 104 to external circuitry or an external device, such as the host 102 that can generate requests to read or write data to and/or from the memory media 118. The central controller 114 is configured to recognize received commands from the host 102 and to execute instructions to apply a particular operation code associated with received host commands for each of a plurality of channels coupled to the memory media 118.

The central controller 114 (e.g., media management layer (MML) 124 in the central controller 114) also includes RAS circuitry for providing RAS functionality to recover from errors and/or inform the host 102 regarding errors that are detected in the LRAID arrays of LRAID circuitry 132 by, for example, ECC/CRC component 130. For example, when a parity error is detected in data obtained from one of the LRAID arrays, the RAS circuitry may operate with the ECC/CRC component 130 and the LRAID circuitry 132 to recover the error. In another example, when an unrecoverable error is detected in such obtained data, the RAS circuitry may inform the host 102 regarding the unrecoverable error (e.g., using a CXL "poison" message).

The scenario illustrated in FIG. 1 is, for example, a LRAID8+1 (with compression) configuration. In this configuration, memory accesses (e.g., read requests and write requests) are made to a LRAID stripe (sometimes referred to simply as "RAID stripe" or "stripe") of data comprising data (e.g., user data) and parity data. The stripe extends or spans over the respective memory banks of each of the eight media components (eight dice). The parity data stored in one particular stripe may be the parity data of that same particular stripe and/or may be the parity data of another stripe(s).

In LRAID, accesses to the media components are "locked" at a particular access granularity. In this example, the access granularity may be considered as 4 channels×64 bytes, with 32 die/rank and 264 byte input/output (IO).

A read size and a burst length are defined for memory accesses. In the illustrated embodiment of FIGS. 1-2, a burst size of 32 bytes and a read size of 1 bytes can be assumed. Thus each read operation reads 32×1=32 bytes of data from a memory component to the cache or other part in the memory controller. Since in a LRAID array, all memory components of the stripe containing the user data are retrieved in a read access, in the LRAID8+1 array scenario, 32 bytes will be read from each of the eight dice LRAID array of one channel.

The parity data of the stripe (assuming that the parity data of the stripe is generated and stored) may comprise parity information for the media components that are contained user data and are parts of that stripe. In an example embodiment, the parity data may be calculated as the bitwise exclusive OR (XOR) of all the user data. More specifically, for example, the first bit of the parity data corresponds to the XOR sum of the first bit of each of the data blocks comprising user data (e.g., user data residing on the respective dice of the stripe), the second bit of the parity data corresponds to the XOR sum of the second bit of each of the data blocks comprising user data (e.g., user data residing on the respective dice of the stripe), and so on.

In configurations where the data accessed from the media components is written to a cache, a LRAID stripe may be sized according to the size of a cache line. For example, when the cache has a 256 byte cache line, a LRAID stripe may be 256 bytes. When a data element (e.g., particular data block) is required to be accessed in a LRAID array, the entire stripe containing that data element is loaded into the cache (or elsewhere in the memory controller).

FIG. 2 graphically illustrates an example storage of compressed user data and RAID parity data in a LRAID8+1 array (with compression). The data stored in the LRAID stripe of eight media components (M dice in which M=8 with the first die being #0 and the eighth die being #7 as shown in FIG. 2) includes user data and RAID parity data. Each die of the eight dice may form a respective media component (e.g., respective ones of media devices or dice collectively referred to as memory media 118) and may be a data block of a fixed size (e.g., 64 bytes).

In particular, FIG. 2 illustrates four user data blocks (UDB; each of the four user data blocks comprising 64 bytes) that has been compressed down such that the number of dice required to store the user data is 5 dice, rather than the 8 dice that would be required to store the user data uncompressed. The parity data also stored in the example stripe illustrated in FIG. 2 is the parity data of the same stripe illustrated in FIG. 2, but alternatively may further include the parity data of another stripe (not illustrated in FIG. 2) since there is enough free space in the stripe illustrated in FIG. 2 to store the parity data of another stripe. In some embodiments, the parity data may include a fixed number of bits for each data block in the stripe. For example, in an embodiment, each of the user data blocks and the parity data block in the same stripe are the same fixed size, and the parity is calculated as a bitwise XOR of all the user data blocks in the stripe.

It will be understood that although the present example scenario above is for an LRAID8+1 (with compression) configuration, the process can be used to detect and optionally correct data errors in LRAID configurations of various sizes. Other examples described in this present disclosure use a LRAID16+1 (with compression) configuration, and the data compression can be used in each of these configurations for reducing the overhead of the LRAID system by eliminating the need of an additional die for storing parity data.

FIG. 3 graphically illustrates an example compression ratio (1.125) above which data compression of user data may be performed by the compression engine or module 127 such that the compressed user data can be stored within a predetermined number N of dice forming the LRAID8+1 array (with compression), in accordance with a present example embodiment. In the example of FIG. 3, N=7. A compression ratio of 1.125 or more will thus mean that a 256 byte stripe of uncompressed data can be compressed such that the compressed data can be stored in 7 dice or less of the 8 dice forming the stripe.

If the compression ratio of the compressed data is less than this compression ratio threshold value of 1.125 and thus the compressed data cannot fit within 7 dice or less (in other words, the compressed data requires more than 7 dice to be stored in the stripe), then the parity data for that stripe must be stored somewhere other than the stripe such as another (different) stripe or not stored at all. The compression engine or module 127 may therefore compress chunks of user data coming from the host 102 to pack up to 8 dice worth of uncompressed data forming the entire stripe (data and parity) into 7 or less dice. Such compression of data so that the compressed data fits into no more than 7 dice out of the 8 dice forming the stripe if the compression ratio which varies according to the bit pattern of data (e.g., repetition pattern of consecutive bits of data) will be possible if the compression ratio is 1.125 or more.

If the compression ratio is less than 1.125, then the stripe data may not be compressible such that it fits within the 7 dice of the 8 dice forming the stripe and the parity information of that stripe cannot be stored in that same stripe and thus must be stored in another stripe or not be stored at all. The number X of stripes stored in the LRAID array which cannot be compressed enough to be stored within the N dice (where N=7 in this case) may be counted and used to determine whether to store the parity data and/or used to determine whether it will be possible to find a rescue stripe in which to store the parity data of an x-type stripe. The compression ratio of the compressed user data stored in one of the plurality of stripes can also be used to determine whether to store parity data of that stripe based at least on the determined compression ratio.

Figure 4A:
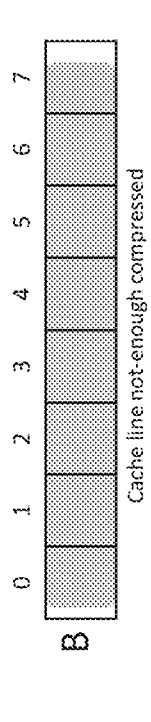
FIG. 4a illustrates a cache line or stripe (A) of sufficiently compressed data, in accordance with the embodiments.

FIG. 4a graphically illustrates compressed data stored in a cache line or stripe A that spans the M dice of one channel (e.g., Ch0 shown in FIG. 1), where M=8 (dice respectively numbered 0 to 7 in FIG. 4a). The user data of the stripe A has been compressed enough (e.g., the compression ratio is high enough such as being greater than a threshold compression ratio value of 1.125) such that the user data of the stripe A fits within N dice where N=7 in this example and is less than M. As can be seen in FIG. 4a, the user data of the stripe A only requires 5 dice (dice #0 to #4) to be stored in stripe A. The free available memory space (see dice #5-#7) in stripe A can therefore be used to store parity data $P_A$ of the stripe A in that same stripe A (see die #7 which stores parity data $P_A$).

Figure 4B:
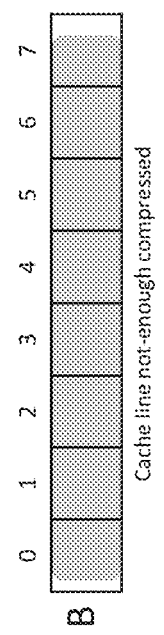
FIG. 4b illustrates a cache line or stripe (B) of insufficiently compressed data, in accordance with the embodiments.

FIG. 4b graphically illustrates compressed data stored in a cache line or stripe B that spans the M dice of one channel, where M=8 (dice respectively numbered 0 to 7 in FIG. 4b). The user data of stripe B has not been compressed enough such that the user data of the stripe B fits within N dice where N=7 in this example. The user data of stripe B thus requires more than 7 dice to be stored. The compression ratio is too low, being less than 1.125 for the compressed user data to be stored within N dice or less wherein N=7 in this case. A determination can be made that there is not enough free available memory space in the cache line or stripe illustrated in FIG. 4b for the parity data $P_B$ of stripe B to be stored in this same stripe B. The parity data $P_B$ of stripe B must therefore be stored in another memory location such as in another stripe or not stored at all.

A determination can be made regarding whether to store the parity data of a particular stripe based on the number of dice required to store the compressed user data of that particular stripe. If the compressed user data of a particular stripe such as the stripe A can be stored on N dice or less where N=7 in this example, the parity data $P_A$ can be stored. If the compressed user data of a particular stripe such as the stripe B cannot be stored on N dice or less where N=7 in this example (i.e., the compressed user data of a particular stripe B must be stored on more than N dice where N=7 in this example), the parity data $P_B$ may in some embodiments not be stored at all.

Alternatively, a determination can be made regarding whether to store the parity data of a particular stripe based on the compression ratio of the compressed user data of that particular stripe. If a calculated compression ratio of a particular stripe such as the stripe A is higher than a predetermined compression ratio threshold value such as 1.125 in this example (and thus the compressed user data of the stripe A can be stored on N dice or less where N=7 in this example), the parity data $P_A$ can be stored.

If the calculated compression ratio of the compressed user data of a particular stripe such as the stripe B is lower than the predetermined compression ratio threshold value such as 1.125 in this example such that the compressed user data of the stripe B must be stored on more than N dice where N=7 in this example, the parity data $P_B$ may in some embodiments not be stored at all.

Assuming that parity data is generated and stored for each of the stripes, a determination can be made regarding where (e.g., in which stripe) the parity data is to be stored. If the compressed user data of a particular stripe such as the stripe A can be stored on N dice or less where N=7 in this example, the parity data $P_A$ can be stored in the position of that same stripe (e.g., the position of the storage location of the parity data $P_A$ of the stripe A is within the same stripe A). If the compressed user data of a particular stripe such as the stripe B cannot be stored on N dice or less where N=7 in this example (i.e., the compressed user data of a particular stripe B must be stored on more than N dice where N=7 in this example), the position of the storage location of the parity data $P_B$ of the stripe B cannot be within the same stripe B and instead may have a storage location positioned within another stripe such as the stripe A.

Figure 5A:
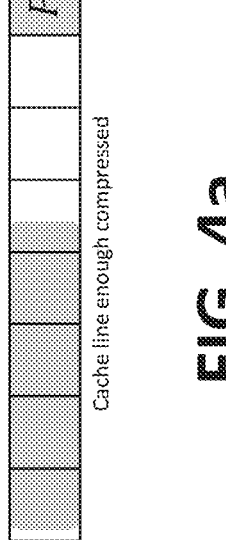
FIG. 5a illustrates another cache line or stripe (A) of data that is sufficiently compressed.
Figure 6:
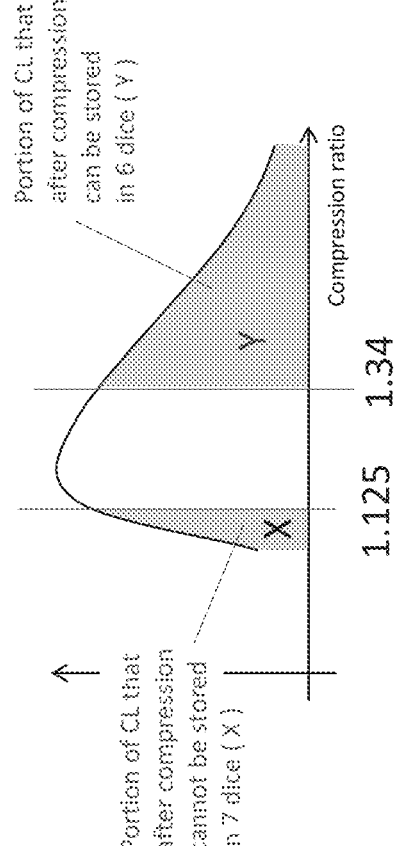
FIG. 6 graphically illustrates an example first compression ratio threshold value (1.125).

FIG. 5a graphically illustrates compressed data stored in a stripe A that spans the M dice of one channel (e.g., Ch0, Ch1, Ch2 or Ch3 shown in FIG. 1), where M=8 (dice respectively numbered 0 to 7 in FIG. 5a). The user data of stripe A has been compressed enough (e.g., the compression ratio is high enough such as being greater than 1.125) such that the user data of the stripe A fits within N dice where N=7 in this example. The user data of stripe A has even been compressed enough (e.g., the compression ratio is high enough such as being greater than a second compression ratio threshold value 1.34 as indicated in FIG. 6) such that the user data of the stripe A fits within P dice or less where P=6 in this example. As can be seen in FIG. 5a, the user data of stripe A only requires 5 dice (dice #0 to #4) of the 8 dice forming stripe A to be stored in stripe A. The free available memory space (see dice #5-#7) in stripe A can also be used to store parity data $P_B$ of another stripe B in that same stripe A (see die #6 which stores parity data $P_B$ of stripe B).

Figure 5B:
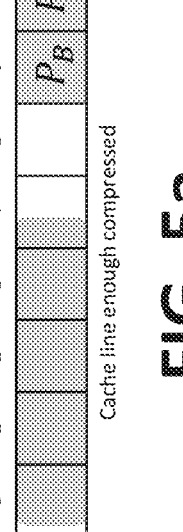
FIG. 5b illustrates another cache line or stripe (B) that is insufficiently compressed.

FIG. 5b graphically illustrates compressed data stored in a stripe B that spans the M dice of one channel, where M=8 (dice respectively numbered 0 to 7 in FIG. 5b). The user data of stripe B has not been compressed enough such that the user data of stripe B fits within N dice where N=7 in this example. As can be seen in FIG. 5b, the user data of the stripe B requires more than N dice to be stored, where N=7 in this example. The compression ratio is thus too low such as being less than the compression ratio threshold value of 1.125 for the compressed user data of stripe B to be stored within 7 dice or less. There is not enough free available memory space in the cache line or stripe illustrated in FIG. 5b for the parity data $P_B$ of stripe B to be stored in this same stripe B. The parity data $P_B$ of stripe B must therefore be stored somewhere else such as in another stripe like the stripe A as shown in FIG. 5a or not stored at all in some present example implementations.

FIG. 6 graphically illustrates an example first compression ratio threshold value (1.125) below which data compression of user data may be performed such that the compressed user data cannot be stored within a first predetermined number N of dice (where N=7 in this case) forming the LRAID8+1 array (with compression) and thus requires that the user data as compressed be stored on more than N dice. In other words, the user data stored in a stripe spanning M=8 dice having a compression ratio less than 1.125 cannot fit within N=7 dice out of the M=8 dice and thus requires that the user data of that stripe be stored on more than N=7 dice (see stripe B of FIGS. 4b and 5b).

FIG. 6 also illustrates an example second compression ratio threshold value (1.34) above which data compression of user data may be performed such that the compressed user data can be stored within a second predetermined number P (P=6 in this example) or less of dice in which P<N<M of dice forming the LRAID8+1 array (with compression), in accordance with an embodiment of the present embodiment (see stripe A of FIGS. 4a and 5a).

The number of stripes having a compression ratio below the compression ratio threshold value such as 1.125 and/or the number of stripes in which the compressed user data cannot be stored within the first predetermined number N of dice (where N=7 in this case) forming the LRAID8+1 array (with compression) and thus requiring that the user data as compressed be stored on more than N dice can counted and assigned a count value X. In this disclosure, a stripe having a compression ratio below a threshold compression ratio value (such as 1.125 in this example) and/or a stripe in which the compressed user data cannot be stored within the first predetermined number N of dice (such as N=7 dice in this example) out of the M dice forming the stripe (such as M=8 in this example) is referred to as "x-type stripe".

If the count value X of the stripes which have not been compressed enough is below a threshold count number (e.g., the portion of x-type stripes within the LRAID8+1 (with compression) array is relatively small), a consideration can be made for each of those x-type stripes to store only the compressed user data without storing the RAID parity data of that stripe at all. This means that a portion of the data stored for these x-type stripe(s) will not be protected against a chip kill.

The threshold count number can be determined based upon the impact of an annual failure rate (AFR) of the system. If the threshold count number determined based upon the AFR remains below a target, this solution in which the RAID parity data for a x-type stripe (e.g., for each and every x-type stripe) is not stored can be implemented in some present example embodiments.

If the count value X of the stripes which have not been compressed enough is above the threshold count number (e.g., the portion of x-type stripes within the LRAID8+1 (with compression) array is relatively large), then an alternative solution can be implemented in some example embodiments to use the free or available memory space of one stripe to store the parity data of another stripe in which the user data is not compressed enough or has too low of a compression ratio. Each x-type stripe will thus be associated with another stripe where the RAID parity data of the x-type stripe can be found.

This other stripe that stores the parity data of the x-type stripe is referred to in this disclosure as a "rescue-type" stripe or a "rescue" stripe. Each x-type stripe can store, as metadata, the location information of its parity data such as the identification of another stripe in which the parity data of the x-type stripe has been stored. This metadata can be formed by a few bits in the x-type stripe, trusting that other eligible stripe(s) have enough free memory space available to store the parity data of the x-type stripe. This metadata stored in the x-type stripe can be updated in the case that the location of the parity data of the x-type stripe changes. For example, metadata providing a pointer to the other stripe storing the parity data of the x-type stripe may change if storage location of the parity data of the x-type stripe changes from one stripe to another stripe.

The number of stripes having a compression ratio above the second compression ratio threshold value such as 1.34 and/or the number of stripes in which the compressed user data can be stored within the second predetermined number P or less of dice (where P=6 in this case and P<N<M) forming the LRAID8+1 array (with compression) can be determined and assigned a count value Y.

A stripe having a compression ratio above the second compression ratio threshold value of 1.34 and/or a stripe in which the compressed user data can be stored within the second predetermined number P of dice will have enough free memory space to store the parity data of another stripe (e.g., when there is not enough memory space in the another stripe [x-type stripe] to store its own parity data) and thus would be a candidate to serve as a "rescue stripe" for that x-type stripe.

If the count value Y is greater than the count value X, then it will be possible to find a rescue stripe for each x-type stripe. In other words, if the count value Y is greater than the count value X, then it will be possible to find a rescue stripe in which to store the parity data of each of the x-type stripe(s).

After parity data of the x-type stripe is written into the associated rescue stripe, the data to be stored and hence storage requirements in the rescue stripe may change. For example, a write operation may be performed such that data even as compressed may require that the rescue stripe storing the parity data of the x-type stripe can no longer host the parity data of the x-type stripe. In such a case, the identity of the rescue stripe that stores the parity data of the x-type stripe can be changed.

The parity data of the x-type stripe stored in a current rescue stripe will be moved to another rescue stripe such that the parity data of the x-type stripe is no longer stored in the first rescue stripe. The parity data of the x-type stripe can no longer host the parity data due to the increased volume of data to be stored by that first rescue stripe. In such a case, the rescue pointer provided by the metadata stored in the x-type stripe must be properly updated to reflect the movement of the parity data of the x-type stripe to a new storage location within the second rescue stripe to which the parity data of the x-type stripe has moved from the first rescue stripe upon that first rescue stripe now being required to store additional data.

If no rescue stripe is available or there is no other cache line stored in the memory media 118, an arbitrary rescue operation can be performed for the x-type stripe to store the parity data. The arbitrary rescue operation may include, for example, storing the parity data of the x-type stripe in the cache memory 126 of the memory device 104.

Figures 7A, 7B:
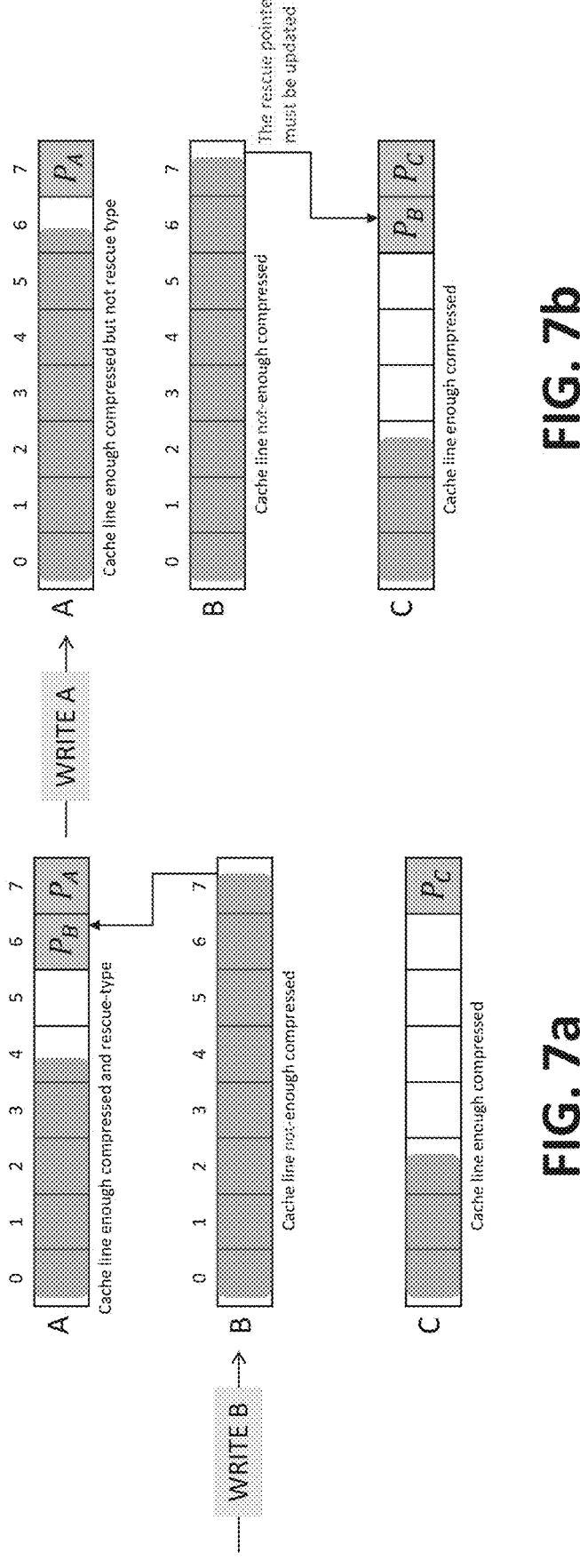
FIGS. 7a-7b illustrates example media access operations including storing parity data of one stripe ("x-type" stripe B) in another stripe ("rescue" stripe A), in accordance with the embodiments.

FIGS. 7a-7b graphically illustrate example media access operations including storing parity data of one stripe ("x-type" stripe B) in another stripe ("rescue" stripe A) and moving that parity data of the one stripe ("x-type" stripe B) to yet another stripe ("rescue" stripe C) and also updating rescue pointer metadata stored in the one stripe ("x-type" stripe B), in accordance with some embodiments of the present disclosure.

Each of FIGS. 7a and 7b illustrate three stripes A, B and C of data. Each of the three stripes A, B and C span over eight memory dice (M dice where M=8) forming the LRAID. While each of FIGS. 7a and 7b illustrates three stripes A, B and C each spanning over eight memory dice in this particular implementation, it will be appreciated that additional stripes of data may be stored in the eight dice of the LRAID and that there may be more than eight memory dice in other example implementations such as 16 memory dice in an LRAID 16+1 (with compression).

Data may be obtained by the memory device 104 from the host 102 through executed write request(s) and compressed by the compression engine 127 to generate compressed data. The compressed data is then stored in the three stripes A, B and C, each of which span the eight memory dice forming a channel (e.g., Ch0, Ch1, Ch2 or Ch3 in FIG. 1) of the memory media 118.

The data stored in stripe B has not been compressed enough (e.g., the data is stored in stripe B has a relatively low compression ratio such as a compression ratio that is less than a threshold compression ratio value of 1.125), and thus a determination can be made that the number dice required for the user data to be stored in this stripe B is not N memory dice or less, wherein N=7 in this example implementation. In other words, the data stored in the stripe B has not been compressed enough to enable the compressed data stored in the stripe B to fit within 7 memory dice and thus requires more than 7 memory dice to store the compressed user data of stripe B.

The parity data $P_B$ of stripe B is therefore stored in another stripe A or not stored at all in some cases. In this example, stripe B may be referred to as an x-type stripe and the stripe A which stores the parity data $P_B$ of the stripe B may be referred to as a "rescue-type" stripe or rescue stripe. Metadata is stored in stripe B to indicate the storage memory location of the parity data $P_B$ of stripe B. In this case, metadata is stored in the x-type stripe B to indicate that the parity data $P_B$ is stored in the rescue stripe A.

In contrast to stripe B, the data stored in each of stripes A and C has been compressed enough such that a determination can be made that the number of dice required to store the user data in each of the stripes A and C is N memory dice or less, wherein N=7 in this example implementation. In other words, the data stored in each of stripes A and C has been compressed enough such that the number of dice required in each of these stripes A and C to store the user data in each of these stripes is 7 or less. The data in each of stripes A and C thus fits within 7 dice, with the 7 dice serving as a threshold number N of dice or memory space for each stripe.

Each of stripes A and C has therefore enough free or available memory space to store the parity data of that stripe. As shown in FIG. 7a for example, the parity data $P_A$ of the stripe A may be stored in the die #7 (i.e., the eighth die) of the same stripe A since the die #7 is free to store the parity data $P_A$ of the stripe A. As also shown in FIG. 7a, the parity data $P_C$ of stripe C may be stored in the die #7 (i.e., the eighth die) of the same stripe C since the die #7 of stripe C is free to store the parity data $P_C$ of the stripe C.

The data stored in each of stripes A and C has been compressed enough such that a determination can be made that the data stored in each of the stripes is stored in P memory dice or less, wherein P=6 in this example implementation utilizing a LRAID 8+1 (with compression) configuration. In other words, the data stored in each of stripes A and C has been compressed enough such that the number of dice required in each of these stripes to store the data in each of the stripes is 6 or less. The data in each of the stripes A and C thus fits within 6 dice, with the 6 dice serving as another threshold number of dice or memory space for each stripe. Each of the stripes A and C has therefore not only enough free or available memory space to store its own parity data ($P_A$ and $P_C$, respectively) of that same stripe, but also has enough free or available memory space to store the parity data (e.g., $P_B$ in this case) of another (x-type) stripe B.

As shown in FIG. 7a for example, the parity data $P_A$ of the stripe A may be stored in the die #7 (i.e., the eighth die) of the stripe A since the die #7 is free to store the parity data $P_A$ of the stripe A and the parity data $P_B$ of the stripe B may be stored in the die #6 (i.e., the seventh die) of the stripe A since the die #6 is free to store the parity data $P_B$ of the stripe B. The parity data $P_A$ of stripe A and the parity data $P_B$ of stripe B are thus both stored in stripe A, and therefore stripe A serves as a rescue stripe storing the parity data $P_B$ for x-type stripe B, although it would have been alternatively possible for stripe C to serve as the rescue stripe (i.e., stripe C is a rescue stripe candidate) storing the parity data $P_B$ for x-type stripe B in view of the amount of free or available memory space in stripe C.

FIG. 7b illustrates execution of a write command by the memory device 104 to write user data to stripe A after rescue stripe A has stored its own parity data $P_A$ as well as the parity data $P_B$ of stripe B as illustrated in FIG. 7a. Data is obtained by the memory device 104 from the host 102 through an executed write request(s) and compressed by the compression engine 127 to generate compressed data. The compressed data is stored in the stripe A which spans the eight memory dice forming a LRAID8+1 array (with compression) of the memory media 118. The data provided in connection with this write request of FIG. 7b is different data than the data initially stored in stripe A (see FIG. 7a). Because of the different data pattern, the compression ratio which depends on the data pattern, is different.

In the example case illustrated in FIG. 7B, the data pattern of this newly executed write request only permits compression with a lower compression ratio, such that the compressed data can only be stored using seven dice (dice #0 to #6) out of the eight dice forming the stripe A. The number of dice (7 in this example illustrated in FIG. 7b) required to store the compressed data in stripe A is therefore N=7 or less, but not P=6 or less. When the host 102 provides a write command to update the stripe A data having this lower compression ratio, then the parity data $P_A$ of stripe A can still be stored in stripe A, but there is no longer enough memory space in stripe A to store the parity data $P_B$ of the stripe B. The stripe A is updated to omit or delete the parity data $P_B$ of the stripe B as can be seen in FIG. 7b.

The parity data $P_B$ of stripe B is therefore written into another storage memory location. In this case, the parity data $P_B$ of x-type stripe B is written in rescue stripe C as illustrated in FIG. 7b. The data in the stripe B is still not compressed enough such that parity data $P_B$ can be stored in stripe B itself. The metadata (including a "rescue pointer" in FIG. 7b) stored in the stripe B indicating the new memory location (in this case, rescue stripe C) of the parity data $P_B$ of stripe B is updated to thereby keep track of the new position of the storage location of the parity data $P_B$.

Figure 8A:
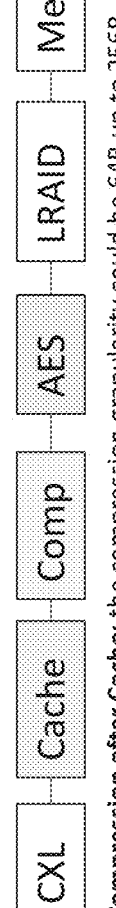
FIGS. 8a-8b illustrates different implementations of the computing system illustrated in FIG. 1, according to embodiments of the present disclosure.
Figure 8B:
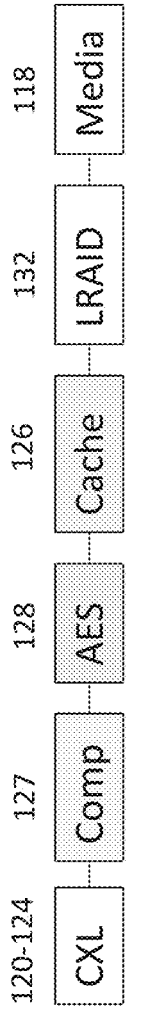

FIGS. 8a-8b illustrate different implementations of the computing system such as the one illustrated in FIG. 1 including a first implementation in which compression is performed after caching of the user data and a second implementation in which compression is performed before cashing of the user data, according to some embodiments of the present disclosure.

In the example implementation of FIG. 8a, the compression of the data is performed after the caching but before the AES encryption. In the example implementation of FIG. 8b, the compression of the data is performed before the caching and before the AES encryption. The compression of the data by the memory device 104 can therefore be after (see FIG. 8a) or before (see FIG. 8b) the caching. In any case, the compression is before AES encryption because the encryption would randomize the data and so with that the compression would be inefficient if implemented after the encryption. That is, the compression stage is performed before the encryption stage to preserve data compression ratios. As noted above, the compression ratio may depend on the data traffic pattern (e.g., a data bit pattern having a relatively large number of consecutively repeating bit values can have a relatively higher compression ratio).

FIG. 9 illustrates a flow chart of a process 200 performed by the memory device 104 of the memory system 100 in which a determination is made regarding whether to store parity data for a stripe, according to some embodiments of the present disclosure.

At block 202, the process 200 begins when the memory device 104 receives a write or read request from a requester (e.g., the host 102) through the communication interface 106 and using the frontend portion 112 including the PCI/PCIe interface 120 and the CXL target controller 122. The memory device 104 obtains data as a result of executing the received write or read request.

At block 204, the data obtained as a result of the execution of the request is compressed by the data compression component 127 of the central controller portion 114 of the memory device 104. The data compression component 127 performs data compression of the obtained data to generate compressed data using any one of many known general compression algorithms to compress the data such as run-length encoding (RLE), LZ77 or LZ78.

At block 206, the central controller portion 114 and the backend portion 116 of the memory device 104 perform operation such that the compressed data is stored in data stripes (e.g., see data stripes A, B and C in FIGS. 4a-4b, 5a-5b and 7a-7b), each of which span over the M dice (M=8 in the example embodiment illustrated in FIGS. 1 and 4a-4b, 5a-5b and 7a-7b) of the LRAID forming the memory media 118. The compression ratio of data stored in one stripe may be different than the compression ratio of data stored in another stripe depending on the data pattern of the data being compressed. For example, the compression ratio of the data stored in the stripe B of FIG. 7a may be lower than the compression ratio of the stripe A or C of FIG. 7a.

The compression ratio of the data stored in each of the stripes A and C may be greater than 1.125 such that the data as compressed in each of these stripes A and C only requires N=7 dice or less out of the 8 dice forming each of the stripes A and C as shown in FIG. 7a, and the compression ratio of the data stored in each of the stripes A and C may also be greater than 1.34 such that the data as compressed in each of these stripes A and C only requires P=6 dice or less out of the 8 dice forming each of the stripes A and C as shown in FIG. 7a.

At block 208, for each stripe, the number of dice or memory devices required to store the compressed data in each of the stripes is determined. For example, the central controller portion 114 of the memory device 104 can perform operation to determine that the number of dice required, out of the eight dice forming each stripe, to store the compressed data is 5 dice for stripe A of FIG. 7a, 8 dice for stripe B in FIGS. 7a, and 3 dice for stripe C in FIG. 7a. Alternatively, and/or additionally, the central controller portion 114 of the memory device 104 can perform operation to determine the compression ratio of the user data stored in each of the stripes A, B, C. As noted in the above example, the compression ratio of the user data stored in the stripe B of FIG. 7a may be lower than the compression ratio of the user data stored in stripe A or C.

At block 210, for each stripe, a determination is made regarding whether the determined number of dice required to store the compressed data in that stripe is N memory dice or less (N<M). In other words, for each stripe, the central controller portion 114 of the memory device 104 can determine whether the compressed data stored in that stripe fits within N memory dice. The value N is therefore utilized as a threshold number of dice. The threshold number indicates whether the compression of the data for one particular stripe is enough such that the particular stripe has sufficient available memory to store its own parity data within that same particular stripe.

In an example implementation in which M=8, N can be defined as the value 7 (N=7<8=M). In the example implementation of FIG. 7a, the memory device 104 can therefore determine that the number of dice required for storing the compressed data in stripe A of FIG. 7a is 5, determine that the number of dice required for storing the compressed data in the stripe B of FIG. 7a is 8, and determine that the number of dice required for storing the compressed data in stripe C of FIG. 7a is 3.

In the example implementation of FIG. 7a, the memory device 104 can therefore determine that the 5 dice required for storing the compressed data in stripe A of FIG. 7a is less than N (N=7), determine that the 8 dice required for storing the compressed data in the stripe B of FIG. 7a is not less than N (N=7), and determine that the 3 dice required for storing the compressed data in stripe C of FIG. 7a is less than N (N=7). The number of dice required for storing the compressed data in each of stripes A and C therefore fits within the N (N=7) memory dice, whereas the number of dice required for storing the compressed data in stripe B does not fit within the N (N=7) memory dice.

Alternatively, and/or additionally, the memory device 104 can perform operations to determine whether the compression ratio of the user data stored in each of the stripes A, B, C is greater or less than a first compression ratio threshold value such as 1.125. For example, the memory device 104 can determine that the compression ratio of the compressed user data of stripes A and C of FIG. 7a is greater than the first compression ratio threshold value of 1.125.

Thus, the number of dice required for storing the compressed data in the stripes A and C is N (N=7) or less out of the M (M=8) dice for each the stripes A and C. The memory device 104 may also determine the compression ratio of the compressed user data of stripe B of FIG. 7a is less than the first compression ratio threshold value of 1.125. As a result, the number of dice required for storing the compressed data in the stripe B is not less than N (N=7) such that the number of dice required for storing the compressed user data in stripe B does not fit within the N (N=7) memory dice.

At block 212, for each stripe, it is determined whether to store the parity data for that stripe based at least on whether the determined number of dice required to store the compressed data in that stripe is N memory dice or less. Alternatively, or additionally, storing the parity data of the stripe may be based at least on whether the determined compression ratio of the compressed user data in a stripe is above or below the first compression ratio threshold value. In other words, for each stripe, the memory device 104 determines whether to store the parity data for that stripe based on whether the compressed data stored in that stripe fits within the N memory dice (N=7 in this example embodiment) memory dice. The memory device 104 may also determine whether to store the parity data for that stripe based on whether the compressed data has a compression ratio greater or less than the first predetermined compression ratio threshold value.

In connection with block 212 involving determining whether to store parity data of that one of the stripes, based at least on whether the number of memory dice required to store the compressed data in each one of the stripes is N memory dice or less, blocks 214-216 of process 200 disclose the case in which the parity data of a particular stripe is stored. If it is determined that the number of memory dice required to store the compressed data in one of the stripes is N memory dice or less (e.g., the data has been compressed such that it fits within N memory dice forming that stripe and/or the data has been compressed such that the compression ratio of the data stored in that stripe is higher than the first predetermined compression ratio value) in block 214, then the parity data of that particular stripe may be stored in block 216.

In the example stripes illustrated in FIG. 7*a*, a determination can be made that the number (5) of memory dice required to store the compressed data in stripe A is N (N=7) or less and/or that the compression ratio of the compressed data in stripe A is relatively high (e.g., higher than the first compression ratio threshold value), and thus the parity data $P_A$ of that particular stripe A may be stored. It may also be determined that the number (3) of memory dice required to store the compressed data in stripe C is N (N=7) or less and/or that the compression ratio of the compressed data in stripe C is relatively high (e.g., higher than the first compression ratio threshold value). If so, the parity data $P_C$ of that particular stripe C may be stored. As shown in FIG. 7A, the parity data $P_A$ of the stripe A may be stored in stripe A itself (e.g., stored in die #7 of stripe A) and the parity data $P_C$ of the stripe C may be stored in stripe C itself (e.g., stored in die #7 of stripe C).

Again, in connection with block 212 as noted above case of blocks 214-216, blocks 220-300 (FIG. 10 shows details of block 300) disclose a case in which the parity data of a particular stripe is not stored. In other words, blocks 220-300 disclose a case in which the parity data of a particular stripe may not be stored, whereas blocks 214-216 disclose the case in which the parity data of a particular stripe is stored. The determination of whether the number of dice required to store the compressed data in that particular stripe is N memory dice or less is thus used to decide between these two cases in which parity data of a particular stripe is not stored (blocks 220-306) or is stored (blocks 214-216). Consider the example case of whether the compressed data stored in that stripe fits within N memory dice and/or the determination of whether the compression ratio of compressed data in that stripe is greater than the first predetermined compression ratio threshold value.

If a determination is made that the number of memory dice required to store the compressed data in one of the stripes is N memory dice or less in block 214, then the parity data of that particular stripe may be stored in block 216. This arrangement applies in the example of determining that the data has been compressed such that it does fit within N memory dice forming that stripe. This arrangement also applies when the data has been compressed such that the compression ratio of the data stored in the stripe is greater than a first predetermined compression ratio value.

If a determination is made that the number of dice required to store the compressed data in the stripe is not N memory dice or less at block 220, then in certain cases (as will be discussed in detail below in regards to block 306 of block 300), the parity data of that stripe in which the number of dice required to store the compressed data in that stripe is not N memory dice or less may not be stored at all. By way of example, this may occur when the compressed data does not fit within N memory dice of the M memory dice forming that stripe and thus requires more than N memory dice to store the compressed data in that stripe. This may also occur when the data has been compressed such that the compression ratio of the data stored in the stripe is less than a first predetermined compression ratio value.

In the example stripes illustrated in FIG. 7*a*, a determination can be made that the number (8) of memory dice required to store the compressed data in stripe B is not N (N=7) or less (compressed data in stripe B does not fit within N memory dice of the M memory dice forming that stripe B and thus requires more than N memory dice to store the compressed data in that stripe B and/or the compression ratio of the compressed data in stripe B is relatively low (e.g., lower than the compression ratio threshold value)), and thus the parity data $P_B$ of that particular stripe B may not be stored at all in block 300 (in particular if block 306 in FIG. 10 of block 300 of FIG. 9).

FIG. 10 illustrates a flow chart of an exemplary process performed by a memory device 104 of the memory system 100 in which operations are performed to determine whether to store the parity data, according to the embodiments. FIG. 10 illustrates the sub-blocks of block 300 of FIG. 9 to determine whether to store the parity data of the stripe—for each (x-type) stripe in which the number of dice required to store the compressed data in the stripe is not N memory dice or less. That is, compressed data in the stripe does not fit within N memory dice and thus requires more than N memory dice to store the compressed data in that stripe. Alternatively, or additionally, the compression ratio of the compressed data in stripe may be relatively low (e.g., lower than a first compression ratio threshold value).

At block 302, the number X of stored stripes in which the number of dice required to store the compressed data in that stripe is not N memory dice or less is counted. That is, the number X of stored stripes in which the compressed data does not fit within N memory dice, thus requiring more than N memory dice to store the compressed data in that stripe is lower than the compression ratio threshold value. Additionally, or alternatively, the number X of stored stripes in which the compression ratio of the compressed data in that stripe may be lower than the compression ratio threshold value.

The number X of x-type stripes stored in the LRAID forming the memory media 118 (e.g., the number of x-type stripes stored in the LRAID forming one channel Ch0) is thus counted. As an example, if the stripes A, B and C of FIG. 7*a* formed all of the stripes stored in the LRAID, then the number X would be equal to one as stripe B is the only x-type stripe stored. Stripe B is an x-type stripe because the number of dice required to store the compressed data in the stripe B is not N memory dice or less, and thus the compressed data does not fit within N memory dice. Stripe B therefore requires more than N memory dice to store the compressed data in that stripe B and/or the compression ratio of the compressed data in stripe B is lower than the first compression ratio threshold value. In contrast, stripes A and C are not x-type stripes and therefore do not increase the count number X because stripes A and C are stripes in which the number of dice required to store the compressed data, in that particular stripe, is N memory dice or less. Additionally, or alternatively, the compression ratio of the compressed data in each of stripes A and C may be higher than the first compression ratio threshold value.

At block 304, the counted number X is compared to a count value threshold to determine if the counted number X is lower or greater than the count number threshold. This count number threshold can be determined based upon the impact of the AFR of the system.

In connection with block 304, in which the counted number X is compared to a count number threshold, if the counted number X is below the count number threshold, the parity data of that stripe, in which the number of dice required to store the compressed data in the stripe is not N memory dice or less, is not stored at all in block 306. This condition may exist when the number of stripes in which the number of dice required to store the compressed data in that stripe is not N memory dice or less dice and thus requires more than N memory dice to store the compressed data in that stripe is relatively small. The condition may also exist when the number of stripes storing data having a compression ratio lower than the first compression ratio threshold value is relatively small.

In the example of FIG. 7a, in which X=1, the parity data $P_B$ of the stripe B is not stored at all if X=1 is less than the count number threshold. While this means that the data stored for x-type stripe B is not stored and hence is not protected against a chip kill, this block is still advantageous for saving memory resources and minimizing processing requirements if the impact of the annular failure rate is acceptable.

In connection with block 304, in which the counted number X is compared to a count number threshold, if the counted number X is above the count number threshold, then the memory device 104 performs operations to store the parity data including determining another stripe in which to store the parity data of that stripe in which the number of dice required to store the compressed data in the stripe is not N memory dice or less at block 308. That is, the number of stripes, in which the number of dice required to store the compressed data in that stripe is not N memory dice or less, is relatively large. Thus, more than N memory dice are required to store the compressed data in that stripe is relatively large and/or the number of stripes storing data having a compression ratio lower than the compression ratio threshold value.

The parity data of each stripe (x-type) in which the number of dice required to store the compressed data in the stripe is not N memory dice or less may be stored in another stripe (rescue stripe). In the example of FIG. 7a, if X=1 is considered too large (greater than the count number threshold which could be zero in some present example embodiments) such that the impact of the AFR of the system is not within acceptable limits, the parity data $P_B$ of the x-type stripe B may be stored, and in particular may be stored in another stripe (rescue stripe). The data stored for x-type stripe B is thus protected against a chip kill.

The parity data $P_B$ of the x-type stripe B may be stored in a rescue stripe such as stripe A in FIG. 7a or stripe C in FIG. 7b, with metadata such as a rescue pointer being written into the x-type stripe B to indicate which the memory location of the parity data $P_B$. The rescue pointer stored in stripe B is indicative of the identity of the rescue stripe (stripe A in FIG. 7a and stripe C in FIG. 7b) that stores the parity data $P_B$.

Before writing the parity data of an x-type stripe (e.g. parity data $P_B$ of the x-type stripe B in FIG. 7a) into a rescue stripe (e.g., stripe A in FIG. 7a or stripe C in FIG. 7b), the amount of free or available memory storage of each of the rescue-stripe candidates (such as both stripe A and C in FIG. 7a) can be checked. The check determines for certain that the rescue stripe which will store the parity data of the x-type stripe is large enough to successfully store the parity data of the x-type stripe.

For example, before writing the parity data $P_B$ of the x-type stripe B in FIG. 7a into the rescue stripe A, the amount of free or available memory storage (e.g., the number of dice in the rescue stripe that is not utilized by the storage of the compressed data is high enough) can be checked. In this example, it can be checked and determined that stripe A only requires five dice to store the compressed data, and thus there is at least one free or available die to provide the necessary memory space to store the parity data $P_B$ of the x-type stripe B. If there are multiple rescue-stripe candidates available in which to write the parity data of the x-type stripe (as is the case in FIG. 7a showing rescue-stripe candidates A and C), the selection of which of the multiple rescue-stripe candidates in which to write the parity data of the x-type stripe can be performed in accordance with a predetermined rule.

An exemplary rule may determine whichever stripe has the most available memory space. The rule may alternatively stipulate a predetermined sequential order (e.g., check with one particular rescue stripe candidate first, and then other candidate(s) in a predetermined sequential order, and so on). By way of example, an arbitrary rescue procedure can be performed such as storing the parity data of the x-type stripe in the cache memory 126 of the memory device 104 if no rescue stripes are available in the memory media 118 forming the LRAID.

FIG. 11 illustrates a flowchart of an exemplary process 400 performed by the memory device 104 of the memory system 100 in which operations are performed to determine whether finding and identifying another stripe (a "rescue" stripe) in which to store the parity data of one stripe ("x-type stripe") may be ensured.

At block 402 of the process 400, the number X of stored stripes in which the number of dice required to store the compressed data in that stripe is not N memory dice or less is counted. That is, the number X of stored stripes in which the compressed data does not fit within N memory dice, requiring more than N memory dice to store the compressed data in that stripe, is counted. Alternatively, the number X of stored stripes in which the compressed data has not been compressed enough, and thus the compression ratio of the compressed user data in the stripe is below the first compression ratio threshold value, may also be counted.

The number X of x-type stripes stored in the LRAID forming the memory media 118 (e.g., the number of x-type stripes stored in the LRAID forming one channel Ch0) is counted. Block 402 is the same as block 302 described above and thus the blocks of process 400, beginning at block 402, could in some present embodiments be performed as a continuation of process 300 at block 302.

At block 404, the number Y of stored stripes in which the number of dice required to store the compressed data in that stripe is P memory dice or less, wherein P is an integer less than N. As discussed above in connection with FIG. 6, an example second compression ratio threshold value (1.34) above, which data compression of data may be performed so the compressed data can be stored within a second predetermined number P (P=6 in this example) or less of dice of out the M dice forming a stripe in which P<N<M of dice forming the LRAID8+1 array (with compression), can be used to count the number Y. The counted number Y thus indicates the number of stripes that will have a relatively high amount of free or available memory space in that stripe. The counted number Y thus indicates the number of stripes that will have enough memory space in that stripe to store the parity data of the x-type stripe.

For example, if the stripes A, B and C of FIG. 7a is formed all of the stripes stored in the LRAID, then the number X would be equal to one as stripe B is the only x-type stripe stored. The counted number P would be equal to two as stripes A and C are stored stripes in which the number of dice required to store the compressed data in each of those stripes A and C is P (P=6) memory dice or less. Since Y is greater than X in the example stripes of FIG. 7a, then a rescue stripe, such as stripe A or C, can be found and identified for storing the parity data $P_B$ of the x-type stripe B.

At block 406, a check is performed to determine if the count number Y is greater than the count number X. When the count number Y is greater than the count number X, it will be possible to find and identify a rescue stripe for each of the x-type stripes. That is, the count number Y is greater than the count number X, meaning that the number of rescue stripe candidates, having enough memory space to store the parity data of another stripe, is greater than the number of x-type stripes whose parity data cannot be stored in this x-type stripe itself. Thus, it is certain that a rescue stripe can be identified for each of the x-type stripes such that the parity data of each of the x-type will be able to be stored in one of the available Y rescue stripe(s).

In connection with block 406, if the count number Y is greater than X, a determination can be made that it will be possible to find a rescue stripe in which to store the parity data of the x-type stripe in block 408. For each x-type stripe, the memory storage available of found rescue stripe candidates is checked to determine the rescue stripe in which to store the parity data of that x-type stripe in block 410 and then the parity data can be written in the determined rescue stripe in block 412. For each x-type stripe, metadata is written in each x-type stripe to indicate which rescue stripe stores the parity data of that x-type stripe in block 414.

In connection with block 406, if the count number Y is not greater than X, it may not be possible to find a rescue stripe in which to store the parity data of each x-type stripe in block 416, and thus an arbitrary rescue can be performed. For each x-type stripe, metadata is written in each x-type stripe to indicate the storage location of the parity data of that x-type stripe in block 418.

FIG. 12 illustrates a flowchart of an exemplary process 500 performed by a memory device 104 of the memory system 100 in which operations are performed including storing parity data of one stripe (x-type stripe) in another stripe (rescue stripe) and moving that parity data of the one stripe to yet another stripe (rescue stripe) and also updating a rescue pointer metadata stored in the one stripe (x-type stripe), according to some embodiments of the present disclosure.

At block 502, for each x-type stripe, the parity data is written in the determined rescue stripe. Here, x-type stripe means the number of dice required to store the compressed data in the stripe is not N memory dice or less—e.g., compressed data does not fit within N memory dice, thus requiring more than N memory dice to store the compressed data in that stripe. It may also mean the stripe in which the compressed data has a compression ratio lower than the first compression ratio threshold. For example, in FIG. 7a, the parity data $P_B$ of the stripe B is written in the stripe A. This block 502 is identical to block 412 of FIG. 11 and thus the process 500 beginning at block 502 could be performed as a continuation of process 400 at block 412.

At block 504, for each x-type stripe, metadata is written in each x-type stripe to indicate the rescue stripe which stores the parity data of that x-type stripe. This block is identical to block 414 of FIG. 11. For example, in FIG. 7a, metadata is stored in the stripe B, such as in die #7 of stripe B, to indicate the storage memory location of the parity data $P_B$ of the stripe B. In this case, metadata stored in the x-type stripe B includes a rescue pointer indicating that the parity data $P_B$ of x-type stripe B is stored in the rescue stripe A.

At block 506, data is obtained via a write operation to write to the rescue stripe that stores the parity data of the x-type stripe. At block 508, the obtained data is compressed by the compression engine or component 127, and the compressed data is written in the rescue stripe. In the example implementation of FIG. 7b, execution of a write command from the host 102, by the memory device 104, results in obtaining, compressing, and writing the data to stripe A after rescue stripe A has stored its own parity data $P_A$, as well as the parity data $P_B$ of stripe B (illustrated in FIG. 7a).

At block 510, a check is performed to determine is the rescue stripe can still host the parity data of the x-type stripe in view of the storage space required to store the compressed data to be written in the rescue stripe. At block 512, if the rescue stripe can still host the parity data of the x-type stripe, storage of the parity data of the x-type stripe in the rescue stripe is continued. For example, if the compression ratio of the compressed data, newly written to the rescue stripe storing the parity data of the x-type stripe, is higher than the compression ratio of the compressed data previously stored by the rescue stripe, then the same rescue stripe can continue to host the parity data of the x-type parity data as before. This is a function of whether the compressed data newly written to the rescue stripe requires the same or a lesser number of dice to store the user data than before.

At block 514 in connection with block 510, if the rescue stripe cannot still host the parity data of the x-type stripe, then the parity data of the x-type stripe can be deleted or removed from the rescue stripe and the parity data of the x-type stripe can be newly written to another rescue stripe. Because of the different data pattern, the compression ratio of the newly obtained data may be lower and thus the newly obtained data as compressed may require more memory dice to be stored in the rescue stripe than the previously stored data in that rescue stripe.

In FIG. 7b, when the host 102 provides a write command to update the stripe A data having a lower compression ratio, then the parity data $P_A$ of the stripe A can still be stored in stripe A. However, there is no longer enough memory space for the parity data $P_B$ of the stripe B, and as a result, stripe A cannot still host the parity data $P_B$ of the stripe B. The stripe A is then updated to omit or delete the parity data $P_B$ of the stripe B. The parity data $P_B$ of the stripe B is therefore written at that time into another storage memory location, namely rescue stripe C as illustrated in FIG. 7b. The storage location of the parity data $P_B$ of stripe B has therefore effectively moved from stripe A to new rescue stripe C.

At block 516, the metadata in the x-type stripe is updated to indicate the parity data of the x-type stripe is now stored in another rescue stripe. The metadata, including a rescue pointer stored in the stripe B indicating the new memory location (in this case, stripe C) of parity data $P_B$ of the stripe B, is updated to keep track of the position of the storage location of the parity data $P_B$.

Figure 13:
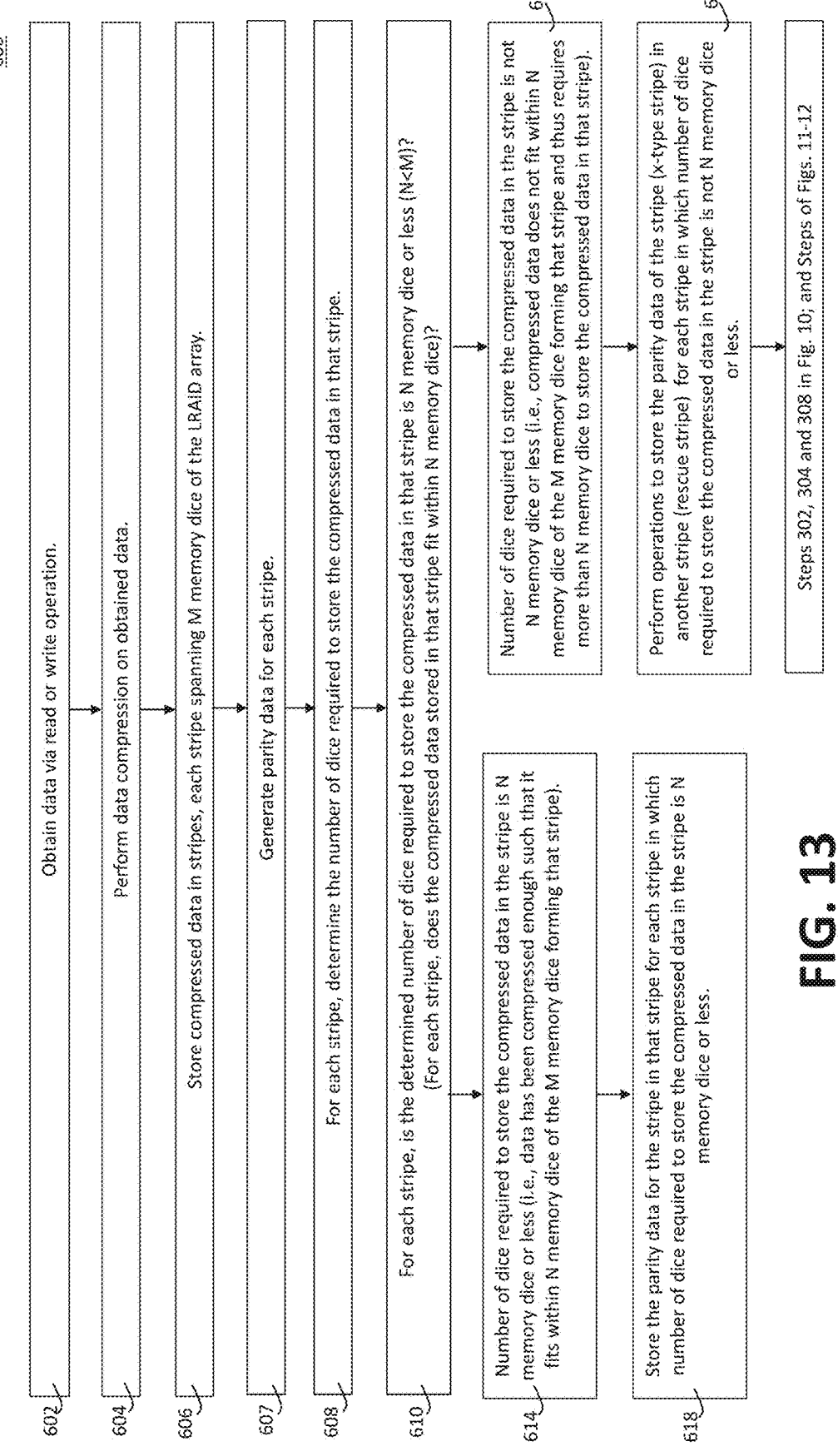
FIG. 13 illustrates a flowchart of still another process performed by a memory device of the memory system, according to the embodiments.

FIG. 13 illustrates a flowchart of an exemplary process 600 performed by the memory device 104 of the memory system 100. In the memory system 100, operations are performed, including determining which of the plurality of stripes stores the parity data of one of the stripes, based upon the determined number of dice required to store the compressed data in the stripe.

Blocks 602, 604, 606, 608 and 610 of FIG. 13 are identical to the blocks 202, 204, 206, 208 and 210 of FIG. 9, respectively. Accordingly, a detailed description of blocks 602, 604, 606, 608 and 610 can be ascertained by reference to these corresponding blocks 202, 204, 206, 208 and 210 of FIG. 9, respectively. The process 600 (FIG. 13) and the process 200 (FIG. 9) could be executed in parallel with these corresponding blocks in the embodiments.

At block 607, parity data is generated for each stripe of data stored in the LRAID. For example, parity data $P_A$ of the stripe A is generated for stripe A, parity data $P_B$ of the stripe B is generated for stripe B, and parity data $P_C$ of the stripe C is generated for stripe C, and so on. As discussed above, the parity data of each of the stripes may be calculated, for example, as the bitwise XOR of all the obtained user data. More specifically, the first bit of the parity data corresponds to the XOR sum of the first bit of each of the data blocks comprising user data (e.g., user data residing on the respective dice of the stripe). The second bit of the parity data corresponds to the XOR sum of the second bit of each of the data blocks comprising user data (e.g., user data residing on the respective dice of the stripe), and so on.

At block 614 in connection with block 610, it may be determined that number of dice required to store the compressed data in the stripe is N memory dice or less (i.e., data has been compressed enough such that it fits within N (e.g., N=7). If memory dice of the M (e.g., M=8) memory dice forming that stripe and/or the data of the stripe has a compression ratio higher than the first compression ratio threshold value), then parity data is stored at block 618 for the stripe in that same stripe (e.g., store the parity data $P_A$ for stripe A in the same stripe A [see FIG. 4a]). This applies where each stripe in which the number of dice required to store the compressed data in the stripe is N memory dice or less. For example, see the parity data $P_A$ for stripe A is stored in the same stripe A in FIG. 7a and the parity data $P_C$ for stripe C is stored in the same stripe C in FIG. 7a.

The user data of stripe A has been compressed enough (e.g., the compression ratio is high enough such as being greater than 1.125) such that the user data of the stripe A shown in FIGS. 4a and 7a, each fit within N dice where N=7 in this example. Indeed, the user data of the stripe A as shown in FIGS. 4a and 7a only requires 5 dice to be stored in stripe A. The available memory space (see dice #5-#7) in stripe A can therefore be used to store parity data $P_A$ of stripe A in the same stripe A (see die #7 which stores parity data $P_A$ in the stripe A shown in FIGS. 4a and 7a).

Which of the plurality of stripes (namely stripe A itself) will store the parity data $P_A$ of the stripe A can be determined based on whether the number of memory dice required to store the compressed data in stripe A is N memory dice or less. Through execution of blocks 614-618, the number of memory dice (5) required to store the compressed data in stripe A is N (N=7) memory dice or less, and in such a case, the identity of the stripe which will store the parity data $P_A$ of the stripe A is determined accordingly to be stripe A itself. Thus, there is no need to look at another stripe to store the parity data $P_A$ of stripe A. Processing requirements can therefore be minimized by not having to look for another stripe to store the parity data $P_A$ of the stripe A and the availability of storage memory of other stripes can be maintained.

At block 620, in connection with block 610, if the number of dice required to store the compressed data in the stripe is not N memory dice or less, then operations are performed at block 622. That is, compressed data does not fit within N memory dice of the M memory dice forming that stripe and thus requires more than N memory dice to store the compressed data in that stripe and/or the data of the stripe has a compression ratio lower than the first compression ratio threshold value. Other blocks, such as blocks 302, 304 and 308 (FIG. 10) and the blocks of FIGS. 11-12 to store the parity data of the stripe (x-type stripe) in another stripe (rescue stripe) are not N memory dice or less. For example, the parity data $P_B$ for x-type stripe B may be stored in rescue stripe A in FIG. 7a or rescue stripe C in FIG. 7b.

Which of the plurality of stripes (e.g., it cannot be stripe B itself) will store the parity data $P_B$ of the stripe B is based at least on whether the number of memory dice required to store the compressed data in stripe B is N memory dice or less. In block 620-622, the number of memory dice (8) required to store the compressed data in stripe B is not N (N=7) memory dice or less. In such a case, the identity of the stripe to store the parity data $P_B$ of the stripe B is determined to not be stripe B itself (contrast with blocks 614-618). Here, it is therefore required to identify another stripe to store the parity data $P_B$ of stripe B because the parity data $P_B$ of the stripe B cannot be stored in the same stripe itself. The precise identity of the rescue stripe for storing the parity data $P_B$ of the x-type stripe B can be determined as discussed above in the blocks of FIGS. 10-12.

In some modern memory system deployments, even traditionally infrequent errors become visible as the aggregate volume of components and bits stored or transferred continue to increase. As the number of repair events that require replacing hardware should be kept to an absolute minimum, there is the need to identify failing components clearly and definitively, and minimize the time spent in repair.

The specific mechanisms used to attain RAS may be a mixture of process technology, architecture, firmware, system software, libraries, and potentially application software. Designing for RAS for a multitude of use cases is enabled by standards such as, for example, the CXL ecosystem, that standardization of certain canonical RAS features, a high degree of visibility into errors and other RAS-related events within a set of components interconnected by the CXL fabric, and the ability to log and communicate these events in a standardized manner to the host to enable RAS actions at the platform level and within operational flows at the data center level.

Memory media failures may be grouped in two classes-random (e.g., single bit) errors and periphery errors. Random errors can be soft errors or hard errors and can be in memory array or on the data link. Periphery errors are caused by such aspects as, for example, neutron strikes, defects in latches, metal contamination, and imbalance in sense amplifiers. As noted above, system resilience is typically determined in accordance with the RAS criteria. According to RAS criteria, reliability from random and periphery errors is provided by 3 mechanisms: ECC—works on payloads composed of bits coming from a single memory media die; LPCK—corrects an entire die failure and provides countermeasure for periphery errors in the memory media; and cyclic redundancy check (CRC)-protects the CXL link and avoids errors reaching the host.

Memory media devices are arranged in schemes such as RAID to spread or stripe data over several memory media devices such as memory disks to improve the access speeds and reduce the possibility of errors. LRAID systems accesses memory media devices arranged in RAID configurations at certain configured access granularities. Although LRAID provides advantages in speed and reliability, some configurations require accessing a substantially larger amount of data in the memory media devices to obtain the much smaller amount of data necessary for read or write request thereby leading to heavy utilization of the interface to memory media devices.

Figure 15:
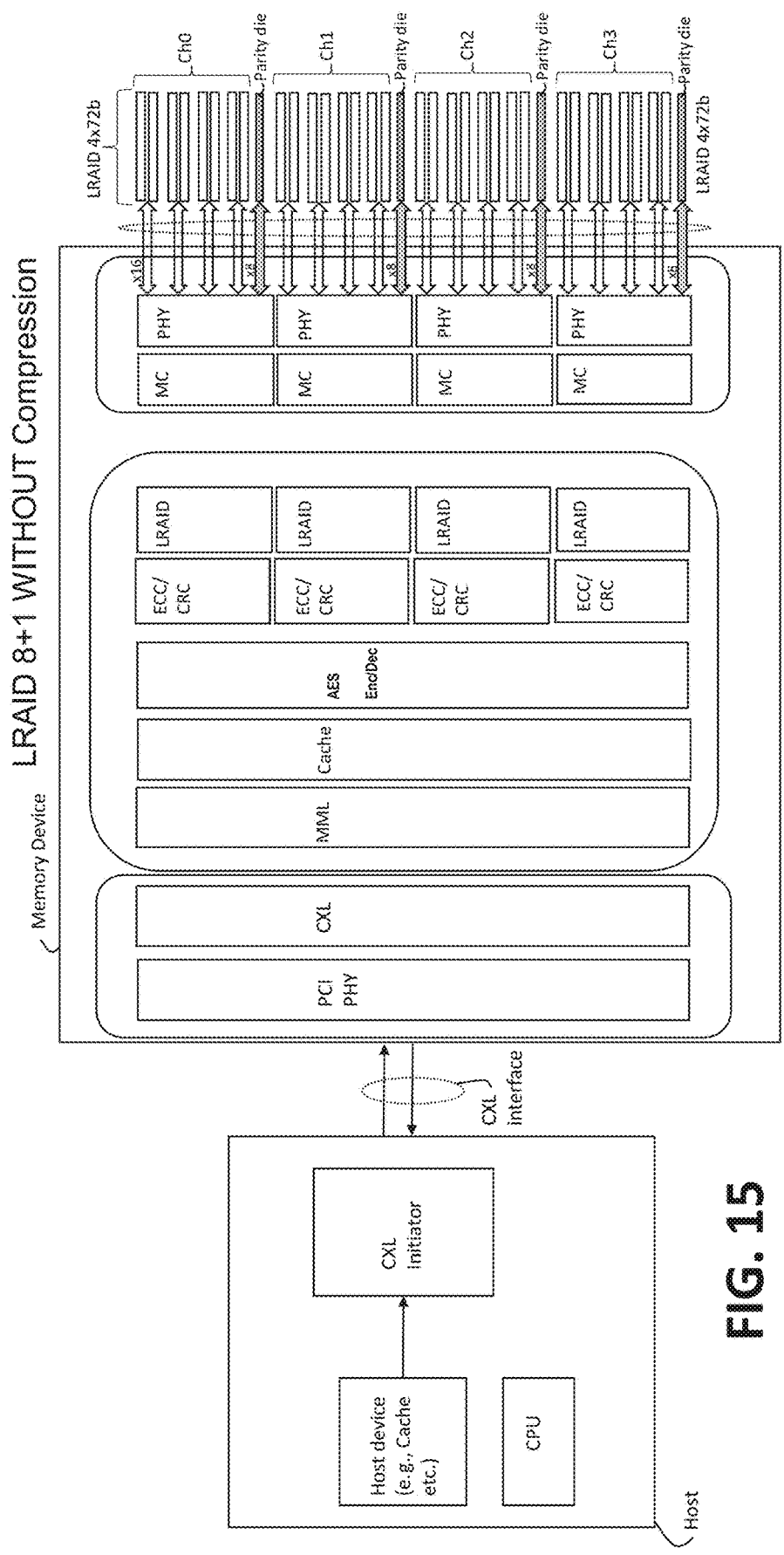
FIG. 15 graphically illustrates a functional block diagram of a conventional computing system including an LRAID8+1 (without compression) array systems that requires an additional memory device to store the RAID parity of the LRAID stripe.

As illustrated in FIGS. 14-15, current LRAID RAS solutions for CXL devices based on LP5/LP5M memory components use an additional memory device (i.e., an additional memory die of the LRAID) to store the RAID parity of the LRAID stripe. This extra die represents an overhead cost for the memory system. For example, FIGS. 14-15 show an LRAID stripe composed of eight dice with the addition of one parity die, which is referred to as a LRAID8+1 case.

This extra die for storing parity data is an overhead cost for the memory system which may be measured in terms of dice overhead. For example, FIGS. 14-15 show an overhead cost of 12.5% for the LRAID8+1 case and an overhead cost of 6.25% in the LRAID16+1 case in which an LRAID stripe is composed of 16 dice with the addition of one parity die. The embodiments provide improved solutions for reducing this overhead cost and hence reduce the total cost of memory systems.

Example embodiments were described above primarily in relation to the CXL 2.0 and/or 3.0 specifications. Moreover, some of the described embodiments described a CXL Type 3 memory device communicating with a host. It will, however, be understood that embodiments are not limited to the CXL or the CXL versions that are specifically mentioned here. Moreover, example embodiments may be applicable to devices other than memory devices.

While the disclosure has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

It should be noted that the methods described above describe possible implementations, and that the operations and the blocks may be rearranged or otherwise modified and that other implementations are possible. Further, portions from two or more of the methods may be combined.

For example, the various illustrative blocks and components described in connection with the disclosure herein (such as those components illustrated in the memory device 104 of FIG. 1) may be implemented or performed with circuitry such as a general-purpose processor, a digital signal processor (DSP), an ASIC, an FPGA, or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

The invention claimed is:

1. A device comprising:
an interface configured to operatively couple to a locked redundant array of independent disks (LRAID) including M memory dice, the M memory dice of the LRAID being configured to store a plurality of stripes of data, and each of the stripes spanning over the M memory dice and wherein M is an integer greater than 1; and
control circuitry operatively coupled to the interface and at least configured to:
obtain data;
perform data compression on the obtained data to generate compressed data;
store the compressed data in the plurality of stripes;
determine, for each of the stripes, a number of memory dice required to store the compressed data;
determine, for each of the stripes, whether or not the number of memory dice that is required to store the compressed data in each of the stripes is N memory dice or less, wherein N is an integer less than M; and
determine, for each of the stripes, whether or not to store parity data of that one of the stripes based at least on the determination of whether or not the number of memory dice required to store the compressed data in the one of the stripes is N memory dice or less.

2. The device according to claim 1, wherein the control circuitry is further configured to:
determine to store the parity data of the one of the stripes based on the determination that the number of memory dice required to store the compressed data in the one of the stripes is N memory dice or less; and
store the parity data of the one of the stripes in the one of the stripes.

3. The device according to claim 1, wherein the control circuitry is further configured to:
determine to not store the parity data of the one of the stripes based at least on the determination that the number of memory dice required to store the compressed data in the one of the stripes is not N memory dice or less.

4. The device according to claim 1, wherein the control circuitry is further configured to:
count a number X of the stripes in which the number of memory dice required to store the compressed data in that respective one of the stripes is not N memory dice or less; and
determine whether or not to store parity data of the one of stripes based on the determination that the number of memory dice required to store the compressed data in the one of the stripes is not N memory dice or less and also based on the number X.

5. The device according to claim 4, wherein the control circuitry is further configured to:
determine to not store the parity data of the one of the stripes, in which the number of memory dice required to store the compressed data in the one of the stripes is not N memory dice or less, based on a determination that the number X is below a threshold count value.

6. The device according to claim 4, wherein the control circuitry is further configured to:
determine to store the parity data of the one of the stripes, in which the number of memory dice required to store the compressed data in the one of the stripes is not N memory dice or less, based on a determination that the number X is above a threshold count value.

7. The device according to claim 6, wherein the control circuitry is further configured to:

store the parity data of the one of the stripes in another one of the plurality of stripes.

8. A device comprising:

an interface configured to operatively couple to a locked redundant array of independent disks (LRAID) including M memory dice, the M memory dice of the LRAID being configured to store a plurality of stripes of data, and each of the stripes spanning over the M memory dice and wherein M is an integer greater than 1; and control circuitry operatively coupled to the interface and at least configured to:

obtain data;

perform data compression on the obtained data to generate compressed data;

store the compressed data in the plurality of stripes;

determine a compression ratio of the compressed data stored in a first one of the plurality of stripes; and determine whether or not to store parity data of the first one of the stripes based at least on the compression ratio.

9. The device according to claim 8, wherein the control circuitry is further configured to:

determine to store the parity data of the first one of the stripes based on the determination that the compression ratio is above a compression ratio threshold; and determine to not store the parity data of the first one of the stripes based at least on the determination that the compression ratio is below the compression ratio threshold.

10. The device according to claim 8, wherein the control circuitry is further configured to:

count a number X of the stripes in which a compression ratio of compressed data stored in each of the respective stripes is below a compression ratio threshold; and determine whether or not to store parity data of the first one of the stripes based on a determination that the compression ratio of the compressed data stored in the first one of the stripes is below the compression ratio threshold and also based on the number X.

11. A method comprising:

operatively coupling an interface to a locked redundant array of independent disks (LRAID) including M memory dice, the M memory dice of the LRAID being configured to store a plurality of stripes of data, and each of the stripes spanning over the M memory dice and wherein M is an integer greater than 1;

obtaining data;

performing data compression on the obtained data to generate compressed data;

storing the compressed data in the plurality of stripes;

determining, for each of the stripes, a number of memory dice required to store the compressed data;

determining, for each of the stripes, whether or not the number of memory dice that is required to store the compressed data in each of the stripes is N memory dice or less, wherein N is an integer less than M; and determining, for each of the stripes, whether or not to store parity data of that one of the stripes based at least on the determination of whether or not the number of memory dice required to store the compressed data in the one of the stripes is N memory dice or less.

12. The method according to claim 11, further comprising:

determining to store the parity data of the one of the stripes based on the determination that the number of memory dice required to store the compressed data in the one of the stripes is N memory dice or less; and storing the parity data of the one of the stripes in the one of the stripes.

13. The method according to claim 11, further comprising:

determining to not store the parity data of the one of the stripes based at least on the determination that the number of memory dice required to store the compressed data in the one of the stripes is not N memory dice or less.

14. The method according to claim 11, further comprising:

counting a number X of the stripes in which the number of memory dice required to store the compressed data in that respective one of the stripes is not N memory dice or less; and determining whether or not to store parity data of the one of stripes based on the determination that the number of memory dice required to store the compressed data in the one of the stripes is not N memory dice or less and also based on the number X.

15. The method according to claim 14, further comprising:

determining to not store the parity data of the one of the stripes, in which the number of memory dice required to store the compressed data in the one of the stripes is not N memory dice or less, based on a determination that the number X is below a threshold count value.

16. The method according to claim 14, further comprising:

determining to store the parity data of the one of the stripes, in which the number of memory dice required to store the compressed data in the one of the stripes is not N memory dice or less, based on a determination that the number X is above a threshold count value.

17. The method according to claim 16, further comprising:

storing the parity data of the one of the stripes in another one of the plurality of stripes.

18. A method comprising:

operatively coupling an interface to a locked redundant array of independent disks (LRAID) including M memory dice, the M memory dice of the LRAID being configured to store a plurality of stripes of data, and each of the stripes spanning over the M memory dice and wherein M is an integer greater than 1;

obtaining data;

performing data compression on the obtained data to generate compressed data;

storing the compressed data in the plurality of stripes;

determining a compression ratio of the compressed data stored in a first one of the plurality of stripes; and determining whether or not to store parity data of the first one of the stripes based at least on the compression ratio.

19. The method according to claim 18, further comprising:

determining to store the parity data of the first of the stripes based on the determination that the compression ratio is above a compression ratio threshold; and determining to not store the parity data of the first one of the stripes based at least on the determination that the compression ratio is below the compression ratio threshold.

20. The method according to claim 18, further comprising:

counting a number X of the stripes in which a compression ratio of compressed data stored in each of the respective stripes is below a compression ratio threshold; and whether or not to store parity data of the first one of the stripes based on a determination that the compression ratio of the compressed data stored in the first one of the stripes is below the compression ratio threshold and also based on the number X.

* * * * *